US011410725B2

(12) United States Patent
Shirakawa et al.

(10) Patent No.: US 11,410,725 B2
(45) Date of Patent: Aug. 9, 2022

(54) MEMORY SYSTEM

(71) Applicant: Kioxia Corporation, Tokyo (JP)

(72) Inventors: Masanobu Shirakawa, Chigasaki (JP); Naomi Takeda, Yokohama (JP)

(73) Assignee: Kioxia Corporation, Tokyo (JP)

( * ) Notice: Subject to any disclaimer, the term of this patent is extended or adjusted under 35 U.S.C. 154(b) by 15 days.

(21) Appl. No.: 17/018,034

(22) Filed: Sep. 11, 2020

(65) Prior Publication Data

US 2021/0217476 A1  Jul. 15, 2021

(30) Foreign Application Priority Data

Jan. 10, 2020 (JP) .............................. JP2020-002717

(51) Int. Cl.
| | | |
|---|---|---|
| *G11C 16/04* | (2006.01) | |
| *G11C 16/08* | (2006.01) | |
| *G11C 16/26* | (2006.01) | |
| *H01L 27/11582* | (2017.01) | |
| *H01L 27/11556* | (2017.01) | |

(52) U.S. Cl.
CPC .......... *G11C 16/08* (2013.01); *G11C 16/0483* (2013.01); *G11C 16/26* (2013.01); *H01L 27/11556* (2013.01); *H01L 27/11582* (2013.01)

(58) Field of Classification Search
CPC ..... G11C 16/08; G11C 16/0483; G11C 16/26; H01L 27/11556; H01L 27/11582
See application file for complete search history.

(56) References Cited

U.S. PATENT DOCUMENTS

| | | | | |
|---|---|---|---|---|
| 9,076,512 B2 * | 7/2015 | Kim | ...................... | G11C 11/21 |
| 9,093,132 B2 * | 7/2015 | Kim | ...................... | G11C 7/10 |
| 10,175,889 B2 * | 1/2019 | Aga | ...................... | G06F 3/0656 |
| 10,847,230 B2 * | 11/2020 | Ando | ...................... | G06F 3/0659 |
| 2016/0011970 A1 | 1/2016 | Sakurada | | |
| 2020/0090761 A1 | 3/2020 | Ando et al. | | |

FOREIGN PATENT DOCUMENTS

| | | |
|---|---|---|
| JP | 2018-164070 A | 10/2018 |
| JP | 2020-047312 A | 3/2020 |

* cited by examiner

*Primary Examiner* — Pho M Luu
(74) *Attorney, Agent, or Firm* — Oblon, McClelland, Maier & Neustadt, L.L.P.

(57) ABSTRACT

A memory system includes: a nonvolatile memory and a memory controller. The nonvolatile memory includes: a first memory cell and a second memory cell each configured to store data and coupled in parallel to a bit line, a first word line coupled to the first memory cell, and a second word line coupled to the second memory cell and differing from the first word line. The first and second memory cell face each other between the first word line and the second word line. The memory controller is configured to read first data from the first memory cell, read second data from the second memory cell, and decode data stored in the first memory cell based on the first data and the second data.

20 Claims, 20 Drawing Sheets

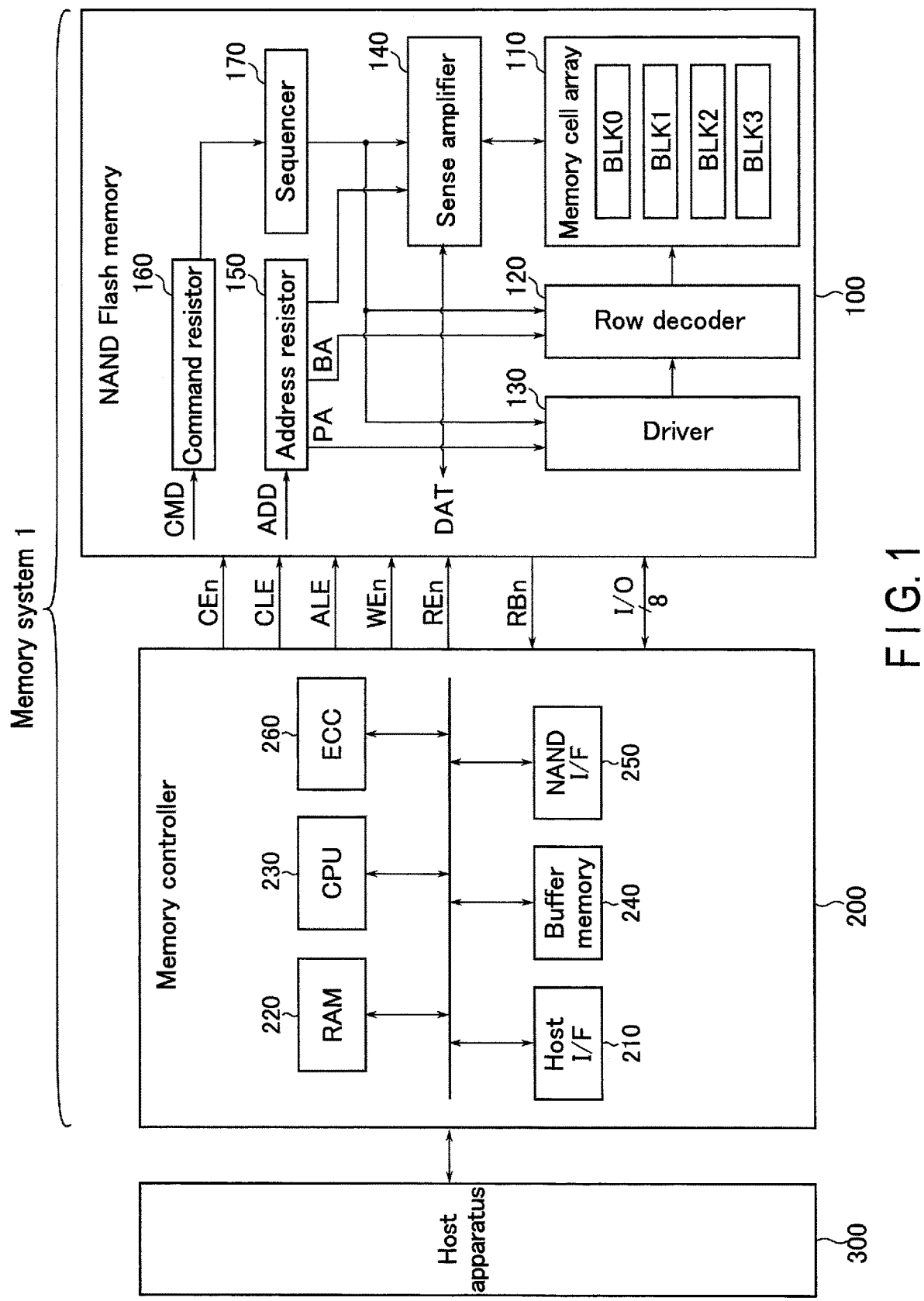
F I G. 1

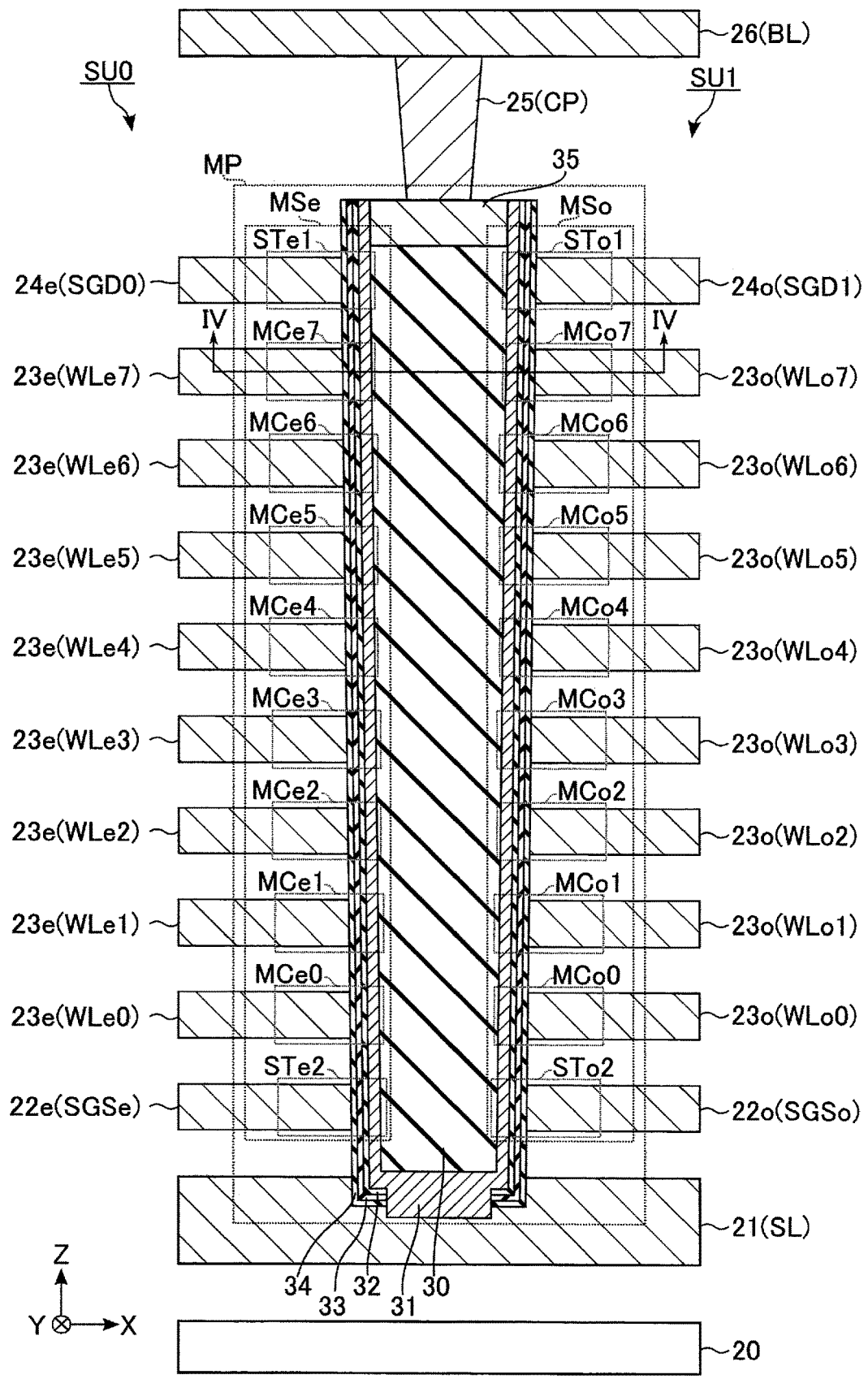
F I G. 3

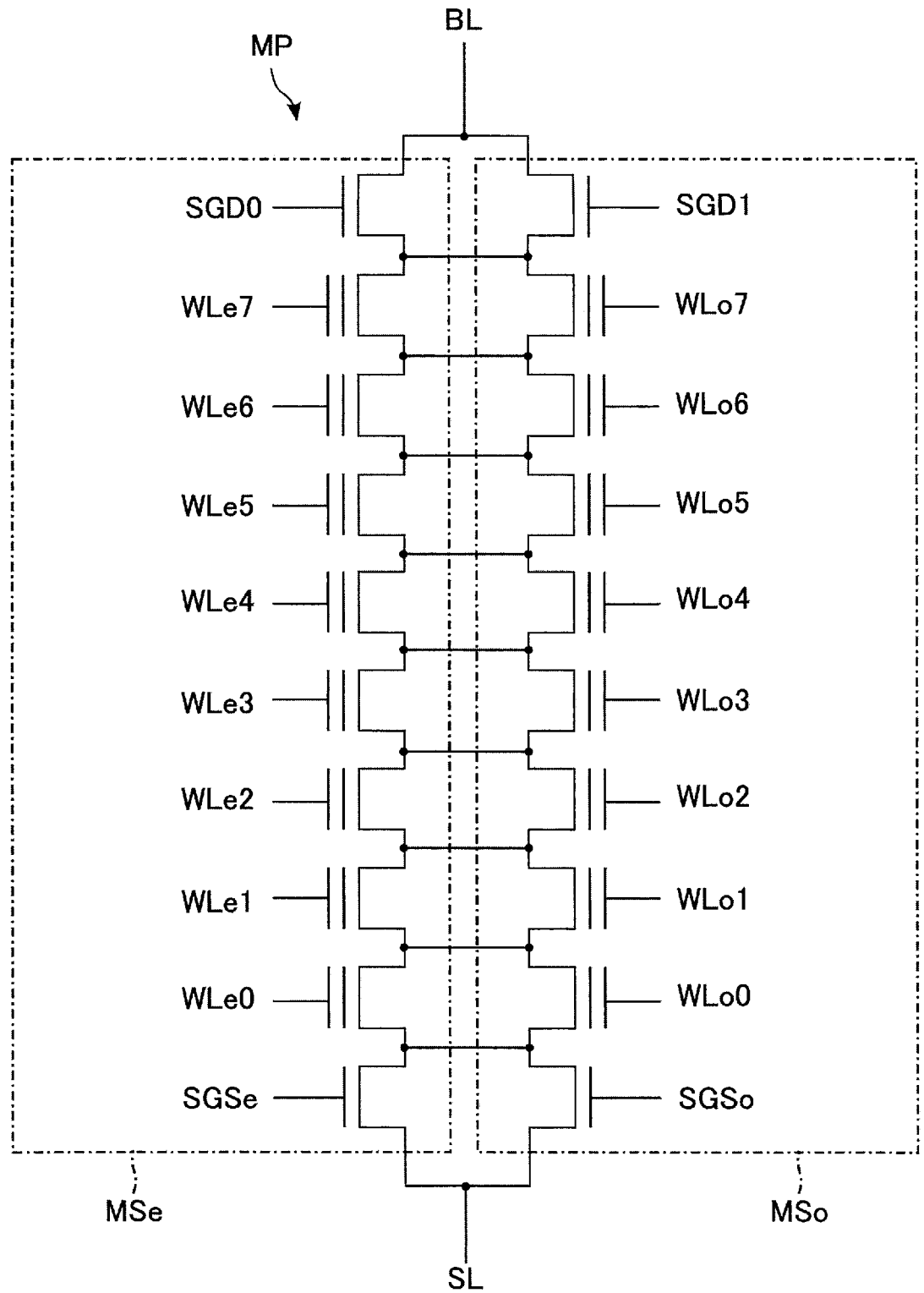
F I G. 5

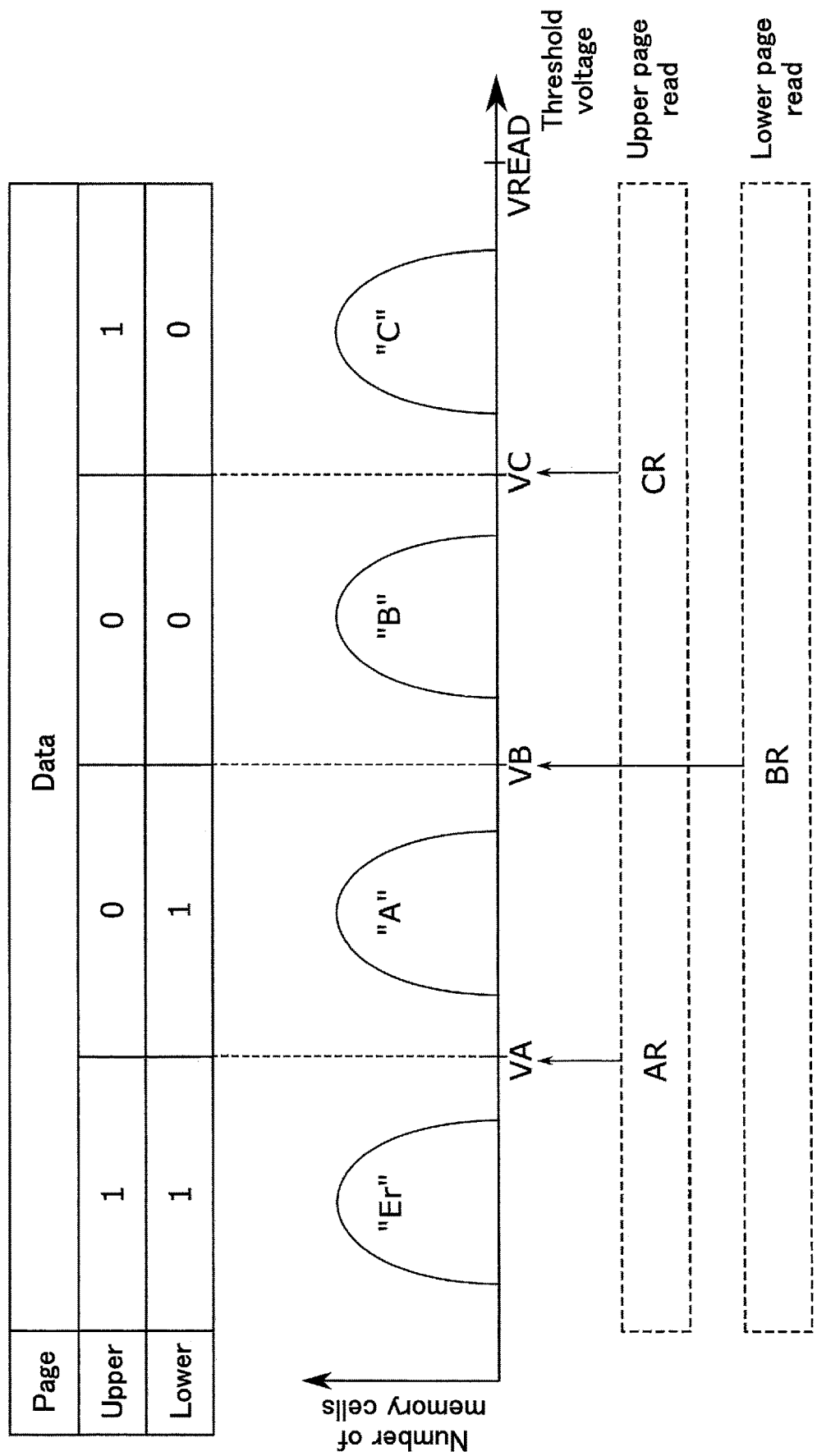
F I G. 6

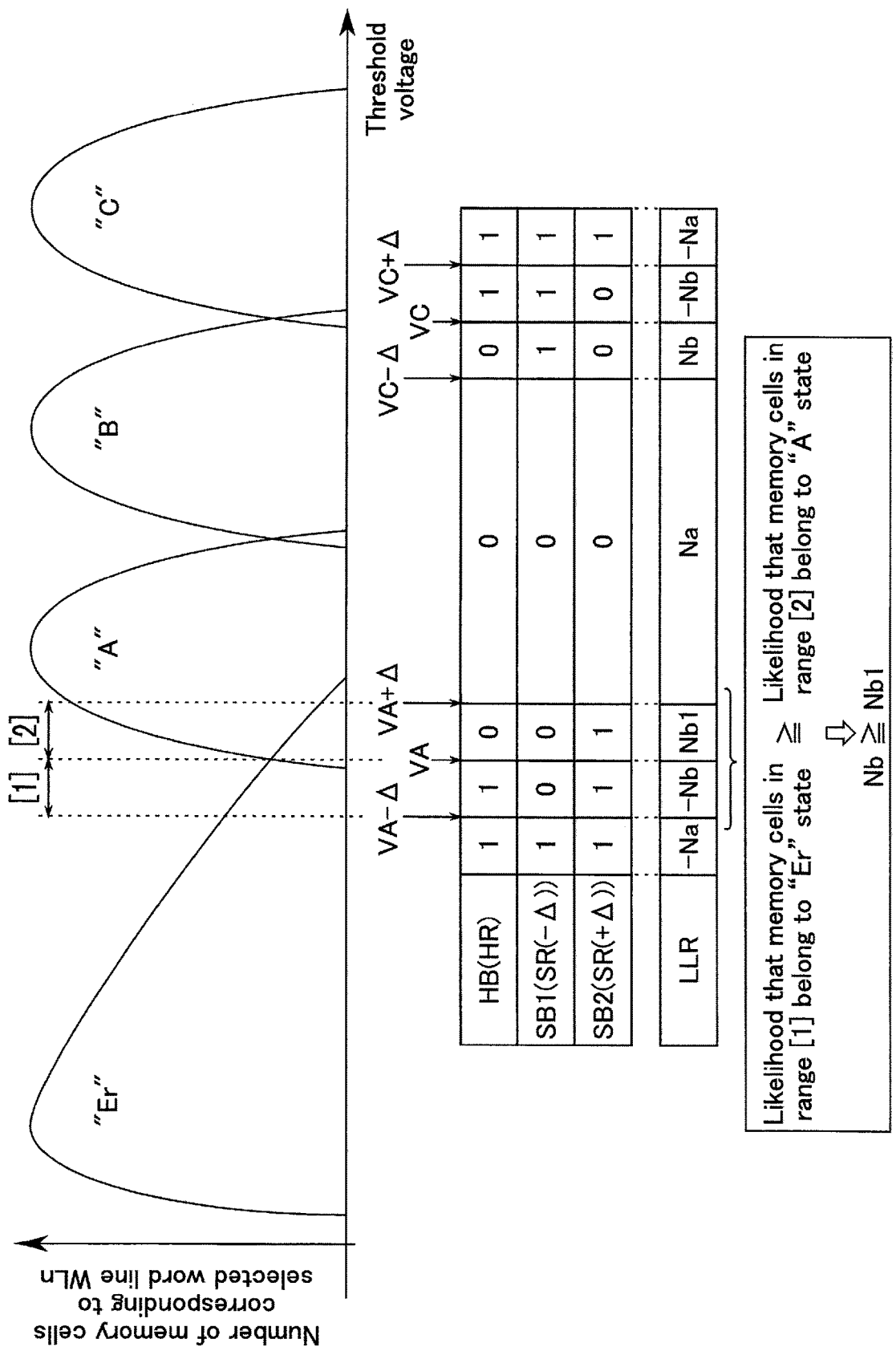
F I G. 10

| | VA−Δ | VA | VA+Δ | | VC−Δ | VC | VC+Δ |
|---|---|---|---|---|---|---|---|
| HB(HR) | 1 | 1 | 0 | 0 | 0 | 1 | 1 |
| SB1(SR(−Δ)) | 1 | 0 | 0 | 0 | 1 | 1 | 1 |
| SB2(SR(+Δ)) | 1 | 1 | 1 | 0 | 0 | 0 | 1 |
| LLR | −Na | −Nb | Nb | Na | Nb | −Nb | −Na |

| | | | | | | | | |
|---|---|---|---|---|---|---|---|---|
| SB3(SSRnb) | 1 | | | | 0 | | | |
| LLR | Nb1 | | | | Nb2 | | | |
| SB4(SSR(n+1)) | 1 | | 0 | | 1 | | 0 | |
| LLR | Nb1 | | Nb3 | | Nb2 | | Nb4 | |
| SB5(SSR(n−1)) | 1 | 0 | 1 | 0 | 1 | 0 | 1 | 0 |
| LLR | Nb1 | Nb5 | Nb3 | Nb7 | Nb2 | Nb6 | Nb4 | Nb8 |

| | VA-Δ | VA | VA+Δ | | VC-Δ | VC | VC+Δ |
|---|---|---|---|---|---|---|---|
| HB(HR) | 1 | 1 | 0 | 0 | 0 | 1 | 1 |
| SB1(SR(-Δ)) | 1 | 0 | 0 | 0 | 1 | 1 | 1 |
| SB2(SR(+Δ)) | 1 | 1 | 1 | 0 | 0 | 0 | 1 |
| LLR | -Na | -Nb | Nb | Na | Nb | -Nb | -Na |

| SB3(SSRnb) | 1 | 1 | 0 | 0 |
|---|---|---|---|---|
| LLR | Nb1 | Nb1 | Nb2 | |

| SB4(SSR(n+1)) | 1 | 1 | 0 | 1 | 0 | 0 |
|---|---|---|---|---|---|---|
| LLR | Nb1 | Nb5 | Nb3 | Nb2 | Nb6 | Nb4 |

| SB5(SSR(n-1)) | 1 | 1 | 0 | 1 | 0 | 1 | 0 |
|---|---|---|---|---|---|---|---|
| LLR | Nb1 | Nb5 | Nb3 | Nb7 | Nb2 | Nb6 | Nb4 |

| SB6(SSRnb_2) | 1 | 1 | 0 | 1 | 0 | 1 | 0 | 1 | 0 | 1 | 0 | 1 | 0 |
|---|---|---|---|---|---|---|---|---|---|---|---|---|---|
| LLR | Nb1 | Nb5 | Nb3 | Nb7 | Nb2 | Nb9 | Nb6 | Nb10 | Nb4 | Nb11 | Nb8 | Nb12 |

| BL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| WLnb | Er | A | B | C | Er | A | B | C | Er | A | B | C | Er | A | B | C |
| WL(n+1) | Er | Er | Er | Er | A | A | A | A | B | B | B | B | C | C | C | C |
| Group | 0 | 2 | 4 | 6 | 1 | 3 | 5 | 7 | 2 | 4 | 6 | 8 | 3 | 5 | 7 | 9 |
| SR(0Δ) | $*_{0,0}$ | | | | | | | | | | | | | | | |
| SR(1Δ) | | $*_{2,1}$ | | | | | | | | | | | | | | |
| SR(2Δ) | | | $*_{4,2}$ | | $*_{1,4}$ | | | | | | | | | | | |
| SR(3Δ) | | | | $*_{6,3}$ | | $*_{3,5}$ | | | | | | | | | | |
| SR(4Δ) | | | | | | | | | $*_{2,8}$ | | | | | | | |
| SR(5Δ) | | | | | | | $*_{5,6}$ | | | $*_{4,9}$ | | | | | | |
| SR(6Δ) | | | | | | | | | | | $*_{6,10}$ | | $*_{3,12}$ | | | |
| SR(7Δ) | | | | | | | | $*_{7,7}$ | | | | | | $*_{5,13}$ | | |
| SR(8Δ) | | | | | | | | | | | | $*_{8,11}$ | | | $*_{7,14}$ | |
| SR(9Δ) | | | | | | | | | | | | | | | | $*_{9,15}$ |
| HB | $*_{0,0}$ | $*_{2,1}$ | $*_{4,2}$ | $*_{6,3}$ | $*_{1,4}$ | $*_{3,5}$ | $*_{5,6}$ | $*_{7,7}$ | $*_{2,8}$ | $*_{4,9}$ | $*_{6,10}$ | $*_{8,11}$ | $*_{3,12}$ | $*_{5,13}$ | $*_{7,14}$ | $*_{9,15}$ |

FIG. 18

| BL | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| WLnb | Er | A | B | C | Er | A | B | C | Er | A | B | C | Er | A | B | C |
| WL(n+1) | Er | Er | Er | Er | A | A | A | A | B | B | B | B | C | C | C | C |
| Group | 0 | 2 | 4 | 6 | 1 | 3 | 5 | 7 | 2 | 4 | 6 | 8 | 3 | 5 | 7 | 9 |
| SR(-1Δ) | $*_{-1,0}$ | | | | | | | | | | | | | | | |
| SR(0Δ) | $*_{0,0}$ | | | | $*_{0,4}$ | | | | | | | | | | | |
| SR(1Δ) | $*_{1,0}$ | $*_{1,1}$ | | | $*_{1,4}$ | | | | $*_{1,8}$ | | | | | | | |
| SR(2Δ) | | $*_{2,1}$ | | | $*_{2,4}$ | $*_{2,5}$ | | | $*_{2,8}$ | | | | $*_{2,12}$ | | | |
| SR(3Δ) | | $*_{3,1}$ | $*_{3,2}$ | | | $*_{3,5}$ | | | $*_{3,8}$ | $*_{3,9}$ | | | $*_{3,12}$ | | | |
| SR(4Δ) | | | $*_{4,2}$ | | | $*_{4,5}$ | $*_{4,6}$ | | | $*_{4,9}$ | | | $*_{4,12}$ | $*_{4,13}$ | | |
| SR(5Δ) | | | $*_{5,2}$ | $*_{5,3}$ | | | $*_{5,6}$ | | | $*_{5,9}$ | $*_{5,10}$ | | | $*_{5,13}$ | | |
| SR(6Δ) | | | | $*_{6,3}$ | | | $*_{6,6}$ | $*_{6,7}$ | | | $*_{6,10}$ | | | $*_{6,13}$ | $*_{6,14}$ | |
| SR(7Δ) | | | | $*_{7,3}$ | | | | $*_{7,7}$ | | | $*_{7,10}$ | $*_{7,11}$ | | | $*_{7,14}$ | |
| SR(8Δ) | | | | | | | | $*_{8,7}$ | | | | $*_{8,11}$ | | | $*_{8,14}$ | $*_{8,15}$ |
| SR(9Δ) | | | | | | | | | | | | $*_{9,11}$ | | | | $*_{9,15}$ |
| SR(10Δ) | | | | | | | | | | | | | | | | $*_{10,15}$ |
| SB1 | $*_{-1,0}$ | $*_{1,1}$ | $*_{3,2}$ | $*_{5,3}$ | $*_{0,4}$ | $*_{2,5}$ | $*_{4,6}$ | $*_{6,7}$ | $*_{1,8}$ | $*_{3,9}$ | $*_{5,10}$ | $*_{7,11}$ | $*_{2,12}$ | $*_{4,13}$ | $*_{6,14}$ | $*_{8,15}$ |
| HB | $*_{0,0}$ | $*_{2,1}$ | $*_{4,2}$ | $*_{6,3}$ | $*_{1,4}$ | $*_{3,5}$ | $*_{5,6}$ | $*_{7,7}$ | $*_{2,8}$ | $*_{4,9}$ | $*_{6,10}$ | $*_{8,11}$ | $*_{3,12}$ | $*_{5,13}$ | $*_{7,14}$ | $*_{9,15}$ |
| SB2 | $*_{1,0}$ | $*_{3,1}$ | $*_{5,2}$ | $*_{7,3}$ | $*_{2,4}$ | $*_{4,5}$ | $*_{6,6}$ | $*_{8,7}$ | $*_{3,8}$ | $*_{5,9}$ | $*_{7,10}$ | $*_{9,11}$ | $*_{4,12}$ | $*_{6,13}$ | $*_{8,14}$ | $*_{10,15}$ |

F I G. 20

MEMORY SYSTEM

CROSS-REFERENCE TO RELATED APPLICATIONS

This application is based upon and claims the benefit of priority from Japanese Patent Application No. 2020-002717, filed Jan. 10, 2020, the entire contents of which are incorporated herein by reference.

FIELD

Embodiments described herein relate generally to a memory system.

BACKGROUND

A memory system that includes a NAND flash memory as a nonvolatile memory, and a memory controller that controls the NAND flash memory is known.

BRIEF DESCRIPTION OF THE DRAWINGS

FIG. 1 is a block diagram for explaining a configuration of a memory system according to a first embodiment.

FIG. 3 is a cross-sectional view for explaining a structure of a memory pillar according to the first embodiment.

FIG. 5 is a circuit diagram for explaining a structure of the memory pillar according to the first embodiment.

FIG. 6 is a schematic diagram for explaining threshold voltage distributions of memory cell transistors according to the first embodiment.

FIG. 10 is a schematic diagram for explaining an LLR table applied in soft-decision processing in the memory system according to the first embodiment.

FIG. 13 is a schematic diagram for explaining an LLR table applied in soft-decision processing in the memory system according to the second embodiment.

FIG. 15 is a schematic diagram for explaining an LLR table applied in soft-decision processing in the memory system according to the third embodiment.

FIG. 18 is a schematic diagram for explaining data generated by the classification processing in the memory system according to the fourth embodiment.

FIG. 20 is a schematic diagram for explaining read data used for soft-decision processing in the memory system according to the fifth embodiment.

DETAILED DESCRIPTION

Figure 2:
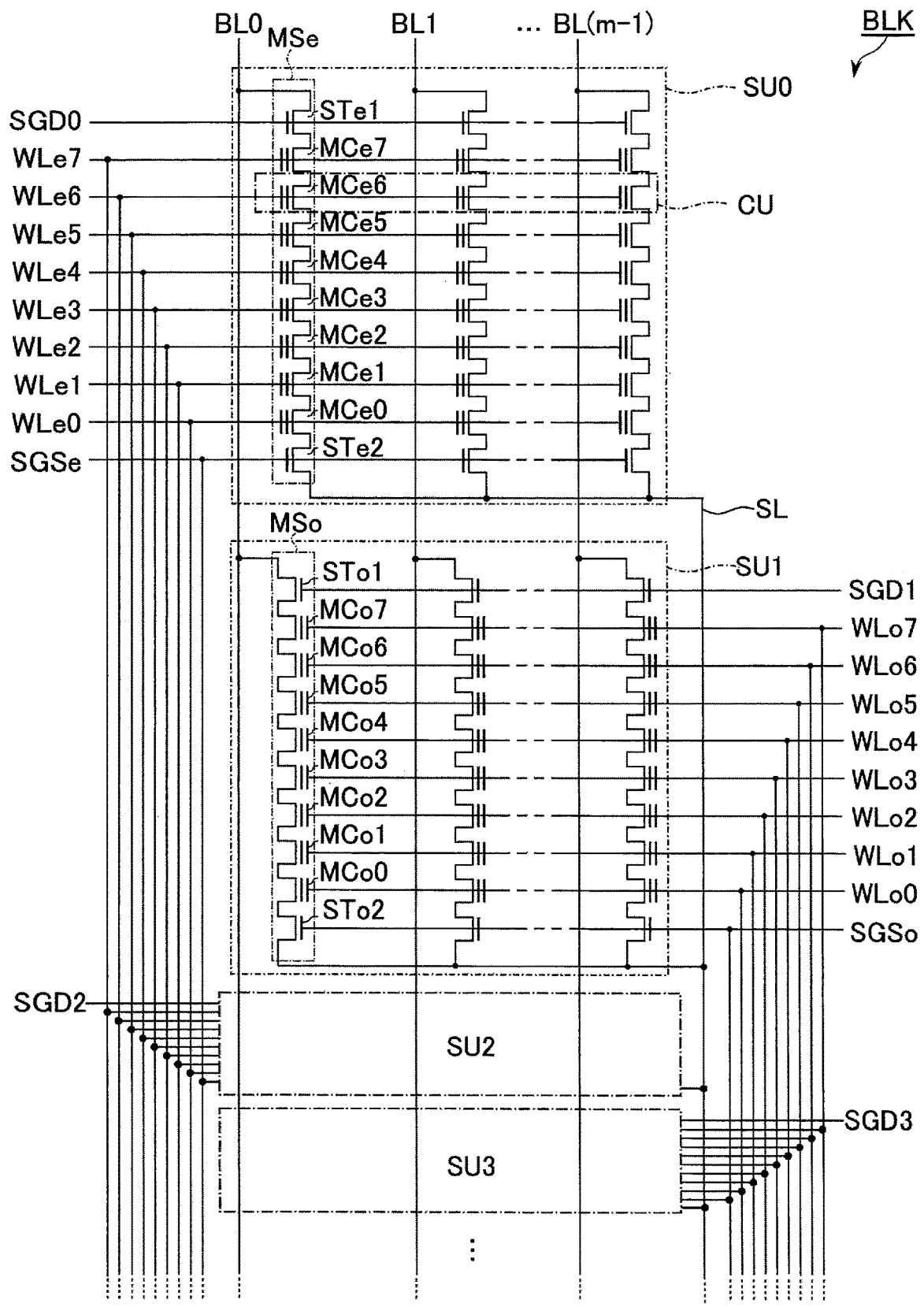
FIG. 2 is a circuit diagram for explaining a configuration of a memory cell array according to the first embodiment.

In general, according to one embodiment, a memory system includes a nonvolatile memory and a memory controller. The nonvolatile memory includes a first and second memory cell each configured to store data and coupled in parallel to a bit line, a first word line coupled to the first memory cell, and a second word line coupled to the second memory cell and differing from the first word line. The first and second memory cell face each other between the first word line and the second word line. The memory controller is configured to read first data from the first memory cell, read second data from the second memory cell, and decode data stored in the first memory cell based on the first data and the second data.

Hereinafter, embodiments will be described with reference to the drawings. In the descriptions below, constituent elements having the same functions and configurations will be denoted by the same reference symbols. To distinguish a plurality of structural elements having a common reference symbol from each other, an additional symbol is added after the common reference symbol. If there is no need of mutually distinguishing a plurality of structural elements, the plurality of structural elements are assigned only a common reference symbols without an additional symbol.

1. First Embodiment

A memory system according to a first embodiment will be described. In the following, a NAND flash memory as a nonvolatile memory, and a memory system including the NAND flash memory will be described as an example.

1.1 Configuration

A configuration of the memory system according to the first embodiment will be described.

1.1.1 Memory System

First, an overall configuration including the memory system according to the first embodiment is described with reference to FIG. 1.

As shown in FIG. 1, a memory system 1 includes a memory device (NAND flash memory) 100 and a memory controller 200. The NAND flash memory 100 and the memory controller 200 may constitute a single semiconductor device in combination, for example. The semiconductor device is, for example, a memory card such as an SD™ card, or a solid state drive (SSD).

The NAND flash memory 100 includes a plurality of memory cells to store data in a nonvolatile manner. The memory controller 200 is connected to the NAND flash memory 100 by a NAND bus and is connected to a host apparatus 300 by a host bus. The memory controller 200 controls the NAND flash memory 100, and accesses the NAND flash memory 100 in response to an instruction received from the host apparatus 300. The host apparatus 300 is, for example, a digital camera or a personal computer, and the host bus is, for example, a bus compliant with an SD™ interface, a SAS (serial attached SCSI (small computer system interface)), a SATA (serial ATA (advanced technology attachment)), or a PCIe (peripheral component interconnect express). The NAND buses transmit and receive signals compliant with a NAND interface.

Specific examples of the signals of the NAND interface are: a chip enable signal CEn, an address latch enable signal ALE, a command latch enable signal CLE, a write enable signal WEn, a read enable signal REn, a ready/busy signal RBn, and an input/output signal I/O.

The signal CEn is a signal that enables the NAND flash memory 100, and is asserted at an "L" (low) level. The signals CLE and ALE are signals to notify the NAND flash memory 100 that the input signals I/O to the NAND flash memory 100 are a command and an address, respectively. The signal WEn is asserted at an "L" level and used to cause the NAND flash memory 100 to take the input signal I/O therein. The signal REn is also a signal that is asserted at an "L" level and used to cause the NAND flash memory 100 to take the output signal I/O therein. The ready/busy signal RBn indicates whether the NAND flash memory 100 is in a ready state (a state where an instruction from the memory controller 200 can be received) or in a busy state (a state where an instruction from the memory controller 200 cannot be received), and the "L" level indicates a busy state. The input/output signal I/O is, for example, an 8-bit signal. The input/output signal I/O is data received and transmitted between the NAND flash memory 100 and the memory controller 200, and is in turn a command CMD, an address ADD, and data DAT such as write data and read data.

1.1.2. Memory Controller

Details of the configuration of the memory controller 200 will be described with reference to FIG. 1. The memory controller 200 is an SoC (system on a chip) for example, and includes a host interface circuit 210, a RAM (random access memory) 220, a CPU (central processing unit) 230, a buffer memory 240, a NAND interface circuit 250, and an ECC circuit 260. The functions of the memory controller 200 and each of the components 210 through 260, which will be described as follows, can be realized by a hardware structure, or a combination of hardware resources and firmware.

The host interface circuit 210 is coupled to the host apparatus 300 via the host bus, and transfers instructions and data received from the host apparatus 300 to the CPU 230 and the buffer memory 240, respectively. The host interface circuit 210 also transfers data in the buffer memory 240 to the host apparatus 300 in response to an instruction from the CPU 230.

The CPU 230 controls the operation of the entire memory controller 200. For example, upon receipt of a write instruction from the host apparatus 300, the CPU 230 issues, in response thereto, a write instruction to the NAND interface circuit 250. Similar processing is performed at the time of a read operation and an erase operation. The CPU 230 also executes various types of processing for managing the NAND flash memory 100.

The buffer memory 240 temporarily stores write data and read data.

The NAND interface circuit 250 is coupled to the NAND flash memory 100 via the NAND bus to communicate with the NAND flash memory 100. Then, the NAND interface circuit 250 outputs the signals CEn, ALE, CLE, WEn, and REn to the NAND flash memory 100 based on the instruction received from the CPU 230. When a write operation is performed, the NAND interface circuit 250 transfers the write command issued by the CPU 230 and the write data in the buffer memory 240 to the NAND flash memory 100 as input/output signals I/O. When a read operation is performed, the NAND interface circuit 250 transfers the read command issued by the CPU 230 to the NAND flash memory 100 as an input/output signal I/O, and receives the data read from the NAND flash memory 100 as an input/output signal I/O and transfers it to the buffer memory 240.

The ECC circuit 260 performs error detection and error correction processes on data stored in the NAND flash memory 100. In other words, the ECC circuit 260 generates an error correction code and provides write data with the error correction code in data writing, and decodes the error correction code in data reading, so as to detect an error bit. If an error bit is detected, the location of the error bit is specified and the error is corrected. An error correction method includes, for example, hard-decision bit decoding and soft-decision bit decoding. As hard-decision bit decoding codes used for the hard-decision bit decoding, BCH (Bose-Chaudhuri-Hocquenghem) codes or RS (Reed-Solomon) codes may be used, and as soft-decision bit decoding codes used for the soft-decision bit decoding, LDPC (low density parity check) codes may be used.

The RAM 220 is, for example, a semiconductor memory, such as a DRAM or an SRAM, and is used as a workspace of the CPU 230. The RAM 220 stores firmware for managing the NAND flash memory 100, various management tables, and the like. As an example of the management table, an LLR (log likelihood ratio) table used for soft-decision bit decoding performed in the ECC circuit 260 can be given.

The LLR table in the present embodiment shows a correspondence between a predetermined bit string of two or more bits and information indicating a log likelihood ratio for each combination of values that the bit string may take. If an absolute value of a log likelihood ratio is greater, a likelihood of the bit string corresponding to the log likelihood ratio is also greater. Details of the LLR table pre-stored in the RAM 220 will be described later.

1.1.3 NAND Flash Memory

Next, a configuration of the NAND flash memory 100 will be described. As shown in FIG. 1, the NAND flash memory 100 includes a memory cell array 110, a row decoder 120, a driver 130, a sense amplifier 140, an address register 150, a command register 160, and a sequencer 170.

The memory cell array 110 includes a plurality of blocks BLK each including a plurality of nonvolatile memory cells associated with rows and columns. FIG. 1 shows four blocks BLK0 to BLK3, as an example. The memory cell array 110 stores data provided from the memory controller 200.

The row decoder 120 selects one of the blocks BLK0 to BLK3 based on a block address BA in the address register 150, and further selects a word line in the selected block BLK.

The driver 130 supplies a voltage to the selected block BLK via the row decoder 120 based on a page address PA in the address register 150.

The sense amplifier 140 in data reading senses a threshold voltage of the memory cell transistor in the memory cell array 110, and reads data. Then, the sense amplifier 140 outputs the data DAT to the memory controller 200. In data writing, the sense amplifier 140 transfers write data DAT received from the memory controller 200 to the memory cell array 110.

The address register 150 stores an address ADD received from the memory controller 200. The address ADD includes the above-mentioned block address BA and page address PA. The command register 160 stores a command CMD received from the memory controller 200.

The sequencer 170 controls the operation of the entire NAND flash memory 100 based on the command CMD held in the command register 160.

1.1.4 Memory Cell Array

Next, the configuration of the memory cell array 110 will be described. FIG. 2 is a circuit diagram of one of the blocks BLK in the memory cell array 110.

As shown in FIG. 2, the block BLK includes a plurality of string units SU (SU0, SU1, SU2, SU3 . . . ), for example. Each of the string units SU includes a plurality of memory strings MS. Hereinafter, the memory string MS in the string unit SUe (SU0, SU2, . . . ) will be referred to as MSe, and the memory string MS in the string unit SUo (SU1, SU3, . . . ) will be referred to as MSo when it is necessary to distinguish the memory strings. As for the other structures and wiring, etc., those belonging to the string unit SUe will be indicated by adding an "e" to the reference symbols, and those belonging to the string unit SUo will be indicated by adding an "o" to the reference symbols, for the sake of distinction.

Each memory string MS includes eight memory cell transistors MC (MC0 through MC7) and select transistors ST1 and ST2, for example. Each memory cell transistor MC is provided with a control gate and a charge storage film, and stores data in a nonvolatile manner. The eight memory cell transistors MC are coupled in series between the source of the select transistor ST1 and the drain of the select transistor ST2.

The gates of the select transistors STe1 included in the string units SUe (SU0, SU2 . . . ) are coupled to select gate lines SGDe (SGD0, SGD2 . . . ), respectively. The gates of the select transistors STo1 included in the string units SUo (SU1, SU3 . . . ) are coupled to select gate lines SGDo (SGD1, SGD3 . . . ), respectively. Each of the select gate lines SGD is independently controlled by the row decoder 120.

The gates of the plurality of select transistors STe2 included in the string units SUe in a same block BLK are coupled in common to the select gate line SGSe, and the gates of the plurality of select transistors STo2 included in the string units SUo in a same block BLK are coupled in common to the select gate line SGSo. Although the select gate lines SGSe and SGSo are independently controllable, they may constitute a single line in this embodiment.

The control gates of memory cell transistors MCe (MCe0 through MCe7) included in the string units SUe in a same block BLK are respectively coupled in common to the word lines WLe (WLe0 through WLe7). On the other hand, the control gates of memory cell transistors MCo (MCo0 through MCo7) included in the string units SUo are respectively coupled in common to the word lines WLo (WLo0 through WLo7). The word lines WLe and WLo are independently controlled by the row decoder 120.

The drains of the select transistors ST1 of the memory strings MS in the same column in the memory cell array 110 are coupled in common to a bit line BL (BL0 through BLm, where m is a natural number). In other words, the bit line BL is coupled in common to a single memory string MSe in each of the string units SUe and a single memory string MSo in each of the string units SUo. Moreover, the sources of the plurality of select transistors ST2 are coupled in common to the source line SL.

In other words, a string unit SU is a group of a plurality of memory strings MS coupled to respective bit lines BL and coupled to the same select gate line SGD. In a string unit SU, a group of memory cell transistors MC coupled in common to the same word line WL may also be called a "cell unit CU".

A block BLK is an assembly of a plurality of string units SUe sharing the same word lines WLe0 through WLe7 and a plurality of string units SUo sharing the same word lines WLo0 through WLo7. A block BLK is a unit of data erasure for example. In other words, data stored in memory cell transistors MC included in a same block BLK is erased in a batch.

The memory cell array 110 is a group of a plurality of blocks BLK sharing a plurality of bit lines BL. The above-described select gate lines SGS, word lines WL, and select gate lines SGD are stacked one by one above a semiconductor substrate, and thereby the select transistors ST2, the memory cell transistors MC, and the select transistors ST1 are three-dimensionally stacked in this order.

Next, the structure including a single memory string MSe and a single memory string MSo of the memory cell array 110 will be described with reference to FIGS. 3 and 4. In the descriptions hereinafter, two directions parallel to the surface of the semiconductor device and orthogonal to each other are defined as an X direction and a Y direction, and the direction orthogonal to a surface including the X and Y directions (XY plane) is defined as a Z direction (stacking direction).

Figure 4:
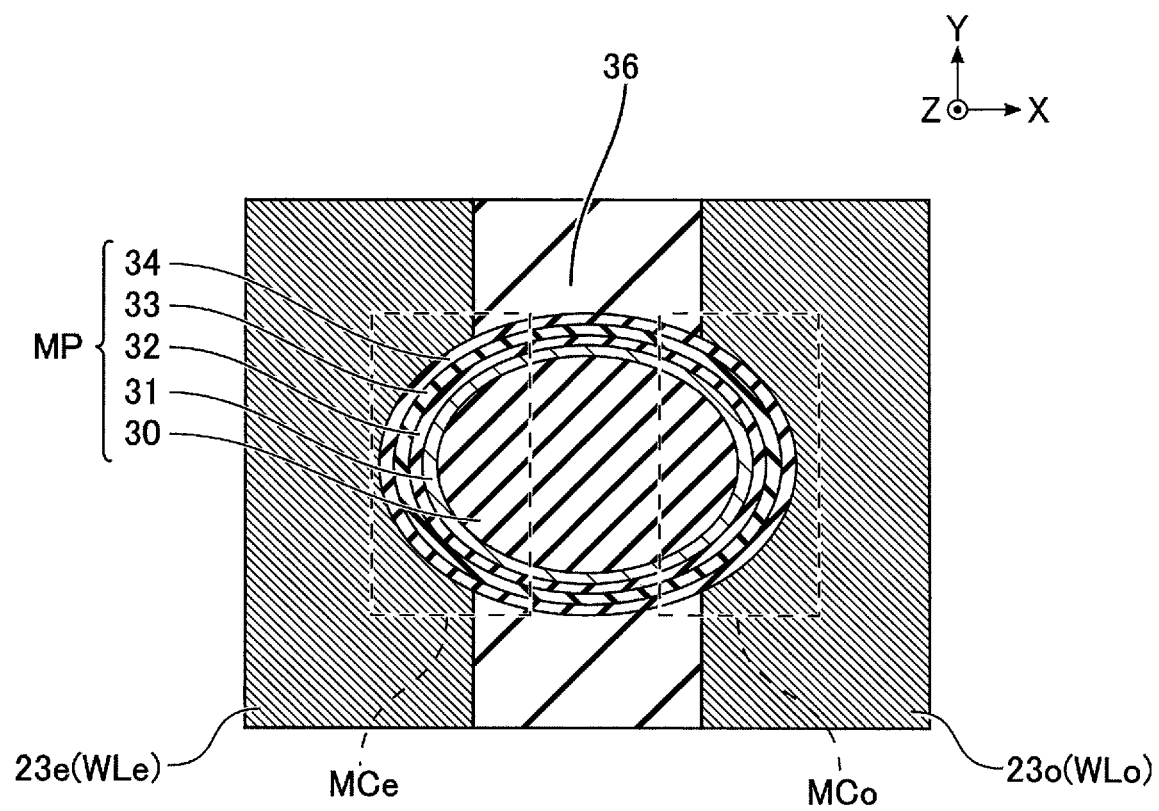
FIG. 4 is a cross-sectional view of the memory pillar along line IV-IV shown in FIG. 3.

FIG. 3 is a cross-sectional view of the structure including the memory strings MSe and MSo, and FIG. 4 is a cross-sectional view along line IV-IV shown in FIG. 3. In FIG. 3, as an example, the structure including the memory string MSe in the string unit SU0 and the memory string MSo in the string unit SU1 arranged facing each other along the Z direction, is shown. In the descriptions hereinafter, the structure including the memory strings MSe and MSo arranged facing each other along the Z direction may be called a "memory pillar MP".

As shown in FIG. 3, a conductor 21 functioning as a source line SL is provided above the semiconductor substrate 20. The conductor 21 is made of an electrically conductive material, and for example an n-type semiconductor doped with impurities or a metal material may be used. The conductor 21 may be a stack of semiconductors and metals. A circuit, such as the row decoder 120 and the sense amplifier 140, etc., may be provided between the semiconductor substrate 20 and the conductor 21.

Above the conductor 21, a conductor 22*e* functioning as the select gate line SGSe and a conductor 22*o* functioning as the select gate line SGSo, which are provided in the same layer, are stacked along the Z direction, with an insulating structure (not shown) interposed between the structure 21 and the structure 22*e* (22*o*). Above the conductor 22*e*, eight layers of the conductor 23*e* functioning as word lines WLe0 through WLe7 are stacked along the Z direction, with an insulating structure (not shown) interposed between adjacent layers. Similarly, above the conductor 22*o*, eight layers of the conductor 23*o* functioning as word lines WLo0 through WLo7 are stacked along the Z direction, with an insulating structure (not shown) interposed between adjacent layers. Above the conductors 23*e* and 230, a conductor 24*e* functioning as the select gate line SGD0 and a conductor 24*o* functioning as the select gate line SGD1 are respectively stacked along the Z direction, with an insulating structure (not shown) interposed between the structure 23*e* (23*o*) and the structure 24*e* (24*o*).

The conductors 22*e* through 24*e* and 22*o* through 24*o* are made of an electrically conductive material, and for example an n-type semiconductor or a p-type semiconductor doped with impurities, or a metal material may be used. For example, as the conductors 22*e* through 24*e* and 22*o* through 24*o*, a structure in which tungsten (W) is covered with titanium nitride (TiN) is used. Titanium nitride functions as a barrier layer to prevent reaction between tungsten and silicon oxide (SiO2) or as a layer for improving adhesion of tungsten, when tungsten is deposited by a chemical vapor deposition (CVD) method. Furthermore, the conductors 22*e* through 24*e* and 22*o* through 24*o* may be obtained by covering the above-described electrically conductive material further with aluminum oxide (AlO).

Above the conductors 24*e* and 24*o*, a conductor 26 is provided with an insulating structure (not shown) interposed. The conductor 26 extends in the X direction for example, and a plurality thereof are arranged in lines in the Y direction and used as bit lines BL. The conductive structure 26 includes copper (Cu), for example.

As shown in FIGS. 3 and 4, a memory pillar MP extending in the Z direction and reaching the conductor 21 at its bottom surface is provided between the conductors 22*e* through 24*e* and 22*o* through 24*o*. The conductors 22*e* and 22*o*, 23*e* and 23*o*, and 24*e* and 24*o* are electrically insulated from each other by the memory pillar MP and an insulating structure 36.

The memory pillar MP includes a core member 30, a semiconductor 31, a tunnel insulating film 32, a charge storage film 33, a block insulating film 34, and a semiconductor 35.

The core member 30 extends in the Z direction, and its upper end is included in the layers above the conductors 24*e* and 24*o*, and its lower end is included in the layers below the conductor 22*e* and 22*o*. The core member 30 includes a silicon oxide for example.

The semiconductor 31 covers the bottom surface and the side surface of the core member 30. The upper end of the semiconductor 31 reaches above the upper end of the core member 30, and the lower end of the semiconductor 31 contacts the conductor 21 below the lower end of the core member 30. The semiconductor 31 includes a polysilicon for example.

The tunnel insulating film 32 covers the side surface of the semiconductor 31; the charge storage film 33 covers the side surface of the tunnel insulating film 32; and the block insulating film 34 covers the side surface of the charge storage film 33. The upper end of each of the tunnel insulating film 32, the charge storage film 33, and the block insulating film 34 reaches a location above the upper end of the core member 30 and equivalent to the upper end of the semiconductor 31. The tunnel insulating film 32 and the block insulating film 34 include a silicon oxide for example, and the charge storage film 33 includes a silicon nitride, for example.

The semiconductor 35 includes a polysilicon for example, and has a bottom surface in contact with the top surface of the core member 30, a side surface in contact with the semiconductor 31, and a top surface reaching the upper end of the memory pillar MP.

On the top surface of the semiconductor 35, the conductor 25 functioning as a pillar-shaped contact CP is provided. The top surface of each of the conductors 25 is in contact with a corresponding one of the conductors 26, and they are electrically coupled.

In the above-described structure, the part where the memory pillar MP intersects with the conductor 22*e* functions as the select transistor STe2, and the part where the memory pillar MP intersects with the conductor 22*o* functions as the select transistor STo2. The part where the memory pillar MP intersects with the conductor 23*e* functions as the memory cell transistor MCe, and the part where the memory pillar MP intersects with the conductor 23*o* functions as the memory cell transistor MCo. The part where the memory pillar MP intersects with the conductor 24*e* functions as the select transistor STe1, and the part where the memory pillar MP intersects with the conductor 24*o* functions as the select transistor STo1.

Thus, the memory cell transistors MCe and MCo are provided on the same layer, facing each other between the conductors 23*e* and 23*o*. Furthermore, the semiconductors 31 are used as channels and well regions of the select transistors STe1 and STo1, the memory cell transistors MCe and MCo, and the select transistors STe2 and STo2. The memory pillar MP thereby functions as a structure including the memory strings MSe and MSo. A plurality of the above-described memory pillars MP are arranged, thereby forming the memory cell array 110.

FIG. 5 is a circuit diagram corresponding to the memory pillar MP shown in FIG. 3.

As shown in FIG. 5, the memory strings MSe and MSo are electrically coupled by an electric current path at their ends and insides, as described above. Specifically, the electric current path between the select transistors STe1 and the memory cell transistor MCe7 is electrically coupled to the electric current path between the select transistor STo1 and the memory cell transistor MCo7. The electric current path between the memory cell transistors MCek and MCe (k+1) adjacent to each other is electrically coupled to the electric current path between the memory cell transistors MCok and MCo(k+1) adjacent to each other (0≤k<7). The electric current path between the memory cell transistor MCe0 and the select transistor STe2 is electrically coupled to the electric current path between the memory cell transistor MCo0 and the select transistor STo2.

The configuration of the memory pillar MP described above is merely an example, and the memory pillar MP may have a different configuration. For example, the number of the conductive layers 23 is determined based on the number of the word lines WL. To the select gate lines SGS and SGD, any number of conductors 22 and 24 may be respectively allocated. If a plurality of layers of the conductor 22 are allocated to the select gate line SGS, different conductors may be used for each of the layers of the conductors 22. Any number of conductors functioning as a dummy word line (not shown) may be provided between the lowest word line WL and the select gate line SGS, and between the highest word line WL and the select gate line SGD. The semiconductor 35 and the conductor 26 may be electrically coupled via two or more contacts, or via other lines.

1.1.5 Threshold Voltage Distributions of Memory Cell Transistors

Next, the threshold voltage distributions of the memory cell transistors MC will be described.

In the present embodiment, one memory cell transistor MT can store, for example, 2-bit data. The bits of the 2-bit data will be referred to as a lower bit and an upper bit in ascending order from the least significant bit. Then, a set of lower bits stored by the memory cell belonging to the same cell unit CU will be called a "lower page", and a set of upper bits will be called an "upper page". Namely, two pages are allocated to a single word line WL (a single cell unit CU) in a single string unit SU, and the string unit SU including eight word lines WL will have a capacity of 16 pages. In other words, "page" may also be defined as a part of a memory space formed in a cell unit CU. Erasure of data may be performed for a unit of a block BLK; on the other hand, reading and writing of data may be performed for a unit of a page, or a cell unit CU.

FIG. 6 is a diagram showing the possible data of each memory cell transistor MC, the threshold voltage distributions, and the voltages used for reading and writing data.

As described above, one memory cell transistor MC can store 2-bit data. Thus, the memory cell transistors MC can take four states in accordance with their threshold voltages. The four states will be referred to as an "Er" state, "A" state, "B" state, and "C" state, in ascending order of threshold voltage. The threshold voltages of memory cell transistors MC in the "Er" state are lower than voltage VA, and the "Er" state corresponds to a data-erased state. The threshold voltages of memory cell transistors MC in the "A" state are equal to or higher than voltage VA and lower than voltage VB (>VA).

The threshold voltage of the memory cell transistors MC in the "B" state is equal to or higher than voltage VB and lower than voltage VC (>VB). The threshold voltages of the memory cell transistors MC in the "C" state are equal to or higher than voltage VC and lower than voltage VREAD. Of the four states accordingly distributed, the "C" state is the highest threshold voltage state. The voltages VA through VC may be collectively called "voltage VCGR". The voltage VREAD is, for example, a voltage applied to non-selected word lines WL in read operations, and turns on memory cell transistors MC regardless of stored data.

The threshold voltage distributions are obtained by writing 2-bit (2-page) data consisting of the above-mentioned lower bit and upper bit. The relationship between the above "Er" state through "C" state and the lower bit and upper bit is as follows:

"Er" state: "11" (written in the order of "upper/lower")
"A" state: "01"
"B" state: "00"
"C" state: "10"

Thus, only one of two bits changes between data corresponding to two adjacent states in the threshold voltage distributions.

Accordingly, when the lower bit is read, a voltage corresponding to the boundary where the value ("0" or "1") of the lower bit changes may be used: this also applies when the upper bit is read.

In other words, as shown in FIG. 6, in lower page reading, voltage VB, which distinguishes between the "A" state and the "B" state, is used as a read voltage. The read operation using the voltage VB will be referred to as read operation BR. The read operation BR determines whether or not the threshold voltage of a memory cell transistor MC is lower than the voltage VB.

When an upper page is read, the voltage VA, which distinguishes between the "Er" state and the "A" state, and the voltage VC, which distinguishes between the "B" state and the "C" state, are used as read levels. The read operations using the voltages VA and VC will be referred to as read operations AR and CR, respectively.

The read operation AR determines whether or not the threshold voltage of a memory cell transistor MC is lower than the voltage VA. In other words, a memory cell transistor MC in an erasure state is specified by the read operation AR. The read operation CR determines whether or not the threshold voltage of a memory cell transistor MC is lower than the voltage VC.

1.2 Operations

Next, an operation of the memory system according to the first embodiment will be described.

In the following example, a case where data is read from an upper page in a cell unit CU corresponding to a word line WLn selected as a read target (referred to as "selected word line WLn" hereinafter) in a certain block BLK will be described ($0 \leq n \leq 7$). In addition, in the descriptions hereinafter, memory cell transistors MC in a cell unit CU corresponding to the selected word line WLn may be referred to as selected memory cells.

A word line WL aligned with the selected word line WLn in the same layer (namely the word line WLon when the word line WLen is the selected word line WLn, or the word line WLen when the word line WLon is the selected word line WLn) will be referred to as "word line WLnb" as needed to distinguish it from the other word lines WL. Furthermore, in a layer adjacent to the layer where the selected word line WLn is arranged, the word lines coupled to the same memory string MS as the selected word line WLn (namely, the word lines WLe(n+1) and WLe(n−1) when the selected word line WLn is the word line WLen, or the word lines WLo(n+1) and WLo(n−1) when the selected word line WLn is the word line WLon) will be referred to as "word lines WL(n+1) and WL(n−1)" as needed to distinguish them from the other word lines WL.

1.2.1 History Read Operation and Shift Read Operation

In above-described FIG. 6, the threshold voltage distribution of each piece of data in a certain cell unit CU is independent from other pieces of data. Accordingly, in the read operation using a read voltage VCGR, it is possible to read correct data, as long as a read voltage VCGR is set between the threshold voltage distributions of different data sets.

However, the threshold voltage may fluctuate for various reasons. As a result, any of the threshold voltage distributions in FIG. 6 may become wider or be shifted; as a result, adjacent threshold voltage distributions may overlap. In such a case, an optimum read voltage (in other words, a voltage expected to have the least errors in read data) is a voltage value corresponding to an intersection of the overlapping threshold voltage distributions, and the optimum read voltage may become different from the originally set read voltage VCGR. Accordingly, it is desirable that the read voltage VCGR be adjustable to an optimum value as needed. In the descriptions hereinafter, a read operation performed with a read voltage VCGR that has been changed from the originally set value will be called a "shift read operation". Among the shift read operations, a shift read operation performed using a shift amount for which the history thereof is managed (in other words, periodically updated) in a table stored in the RAM 220 is called a "history read operation". In other words, the shift read operations include the history read operations.

Figure 7:
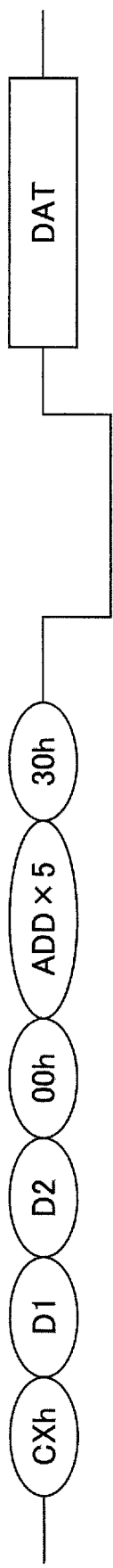
FIG. 7 is a command sequence for explaining a shift read operation in the memory system according to the first embodiment.

FIG. 7 shows a command sequence for explaining the shift read operation (and the history read operation) in the memory system according to the first embodiment.

As shown in FIG. 7, the memory controller 200 issues a command "CXh", and transmits it to the NAND flash memory 100. The command "CXh" is a command for notifying the NAND flash memory 100 that the shift read operation has been performed.

The memory controller 200 issues data D1 and D2 subsequently, and transmits the data to the NAND flash memory 100, for example. The data D1 and D2 includes information indicating a shift amount from the originally set value of the read voltage VCGR which is used for the shift read operation (for example, a digital to analogue convertor (DAC) value)). More specifically, for example, the data D1 includes a shifts amount $\Delta VA$ in the read operation AR, and the data D2 includes a shift amount $\Delta VC$ in the read operation CR.

Subsequently, the memory controller 200 issues a command "00h", and transmits it to the NAND flash memory 100. The command "00h" is a command instruction to read data from the NAND flash memory 100.

The memory controller 200 issues an address ADD over five cycles for example, and transmits it to the NAND flash memory 100. The address ADD designates, for example, a block BLK as a target for reading, and an address of a page in the block BLK.

The memory controller 200 issues a command "30h", and transmits it to the NAND flash memory 100. The command "30h" is a command for performing a read operation for data from the NAND flash memory 100 based on the address ADD transmitted immediately before the command. Thus, the NAND flash memory 100 commences the shift read operation based on the data D1 and D2.

Specifically, the NAND flash memory 100 turns the signal/RB to an "L" level so as to notify the memory controller 200 that the NAND flash memory 100 is in a busy state, and then reads data from the memory cell transistor MC. The data read from the memory cell transistor MC is temporarily stored in the sense amplifier 140.

After the storing data in the sense amplifier 140 is completed, the NAND flash memory 100 changes the signal/RB to an "H" level, and notifies the memory controller 200 that the NAND flash memory 100 is in a ready state.

The memory control 200 repeatedly asserts the signal/RE when the NAND flash memory 100 is caused to enter a ready state. Every time the signal/RE is toggled, the data stored in the sense amplifier 140 is output to the memory controller 200 as read data DAT.

Through the operation as described above, the shift read operation in which the read voltage VCGR is adjusted by the shift amount Δ is finished.

In the descriptions hereinafter, for the sake of explanation, when a history read operation is performed as a shift read operation in which a certain shift amount is applied, the history read operation may be called "history read operation HR". In addition, when a shift read operation in which a further shift amount Δ is applied to the history read operation HR, the shift read operation may be called "shift read operation SR (Δ)".

1.2.2 Single-State Read Operation

Next, a single-state read operation used in the first embodiment as a further read operation will be described.

As described above, the shift read operation confirms data of a specific page by applying one read voltage VCGR or a set of different read voltages VCGR. In contrast, in the single-state read operation, a single read voltage VSSR is applied to confirm the relationship in amplitude between the applied read voltage VSSR and a threshold voltage. For this reason, the number of times of reading is less in the single-state read operation than the shift read operation, and it is therefore possible to perform the single-state read operation in a shorter time than the time required for the shift read operation.

Figure 8:
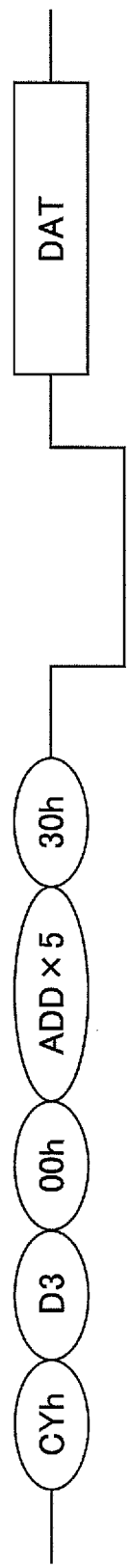
FIG. 8 is a command sequence for explaining a single-state read operation in the memory system according to the first embodiment.

FIG. 8 is a command sequence for explaining a single-state read operation in the memory system according to the first embodiment.

As shown in FIG. 8, the memory controller 200 issues a command "CYh", and transmits it to the NAND flash memory 100. The command "CYh" is a command to notify the NAND flash memory 100 that a single-state read operation has been performed.

The memory controller 200 issues data D3 and transmits it to the NAND flash memory 100, for example. The data D3 includes information indicating a read voltage VSSR used for a single-state read operation.

As the sequence hereafter is the same as the shift read operation shown in FIG. 7, the description is omitted.

Through the operation as described above, the single-state read operation in which the amplitude relationship between the read voltage VSSR and the threshold voltage is output as read data DAT is finished.

In the descriptions hereinafter, for the sake of explanation, when a single-state read operation is performed for a cell unit CU corresponding to the word line WLnb, the single-state read operation may be called "single-state read operation SSRnb". In addition, when single-state read operations are performed respectively for cell units CU corresponding to the word lines WL(n+1) and WL(n−1), the single-state read operations may be called "single-state read operations SSR(n+1) and SSR(n−1), respectively.

1.2.3 Retry Read Operation

Next, a retry read operation in the memory system according to the first embodiment will be described. A retry read operation includes a series of sequences for obtaining error-corrected data DAT by the memory controller 200 through a use of the above-described shift read operation and single-state read operation, and error correction processing by the ECC circuit 260.

Figure 9:
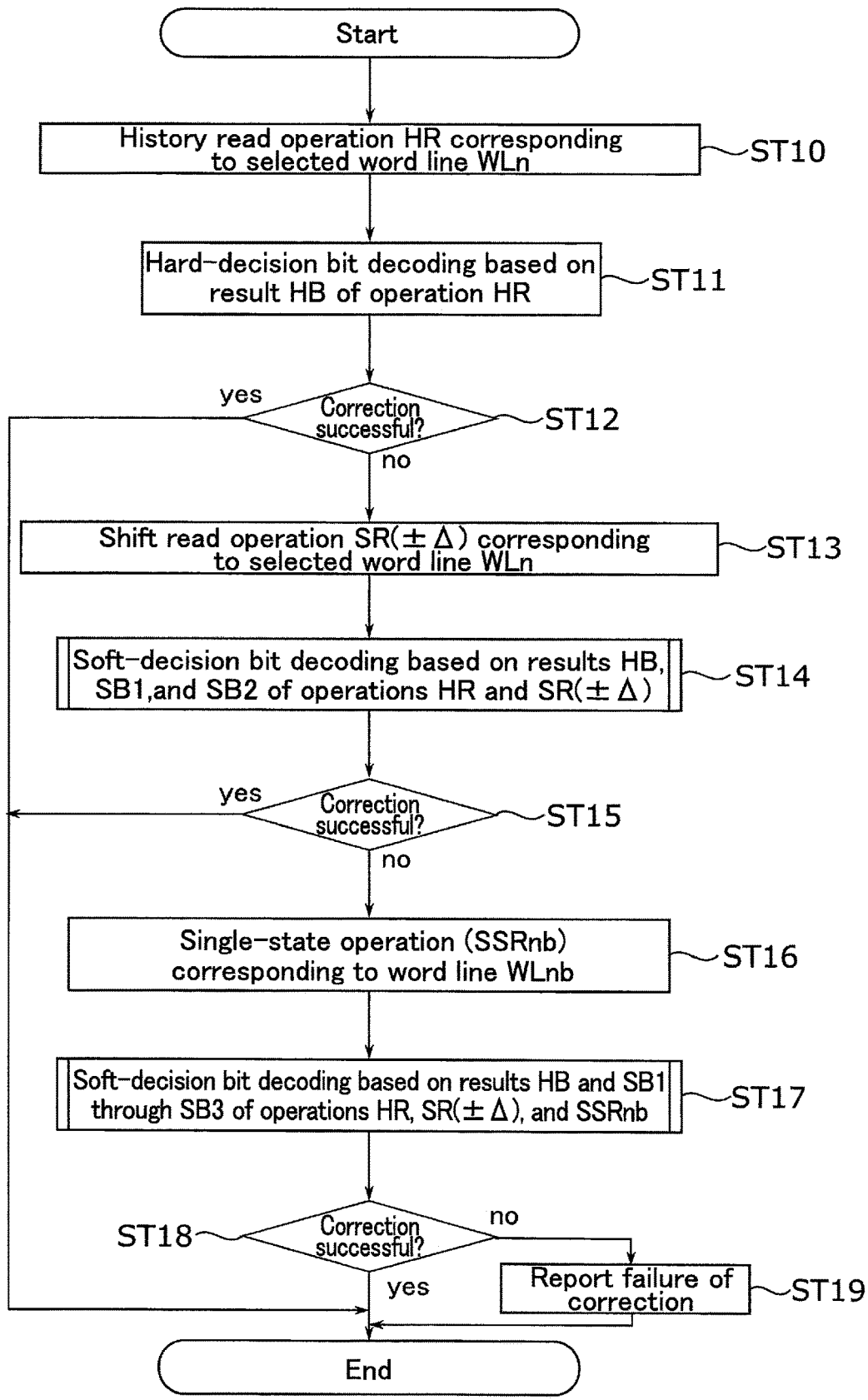
FIG. 9 is a flowchart for explaining a retry read operation in the memory system according to the first embodiment.

FIG. 9 is a flowchart for explaining the retry read operation in the memory system according to the first embodiment.

As shown in FIG. 9, in step ST10, the memory system 1 performs a history read operation HR on a cell unit CU corresponding to the selected word line WLn. Thus, the memory controller 200 obtains a read result HB of the history read operation HR from the NAND flash memory 100.

In step ST11, the ECC circuit 260 performs hard-decision bit decoding based on the result HB of the operation HR.

In step ST12, if an error is corrected by the hard-decision bit decoding in step ST11 (Yes in step ST12), the memory controller 200 returns the error-corrected read data based on the hard-decision bit decoding to the host apparatus 300, and finishes the retry read operation. On the other hand, if an error cannot be corrected because the number of error bits exceeds the number of correctable error bits for the hard-decision bit decoding (No in step ST12), the processing proceeds to step ST13.

In step ST13, the memory system 1 performs shift read operations SR(−Δ) and SR(+Δ) (collectively shown as "operation SR(±Δ)" in FIG. 9) on the cell unit CU corresponding to the selected word line WLn. Thus, the memory controller 200 obtains a read result SB1 of the shift read operation SR(−Δ) and a read result SB2 of the shift read operation SR(+Δ) from the NAND flash memory 100.

In step ST14, the ECC circuit 260 performs soft-decision bit decoding based on the results of HB, SB1, and SB2 of the operations HR, SR(−Δ) and SR(+Δ).

In step ST15, if an error is corrected by the soft-decision bit decoding in step ST14 (Yes in ST15), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST15), the processing proceeds to step ST16.

In step ST16, the memory system 1 performs the single-state read operation SSRnb on the cell unit CU corresponding to the word line WLnb. Thus, the memory controller 200 obtains a read result SB3 by the single-state read operation SSRnb from the NAND flash memory 100.

In the operation SSRnb, a voltage of a certain value may be applied to the word line WLnb, for example, a read voltage VB.

In step ST17, the ECC circuit 260 performs soft-decision bit decoding based on the results HB, SB1, SB2, and SB3 of the operations HR, SR(−Δ), SR(+Δ), and SSRnb.

In step ST18, if an error is corrected by the soft-decision bit decoding in step ST17 (Yes in ST18), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST18), the processing proceeds to step ST19.

In step ST19, the memory controller 200 notifies the host apparatus 300 that the error cannot be corrected by the retry read operation, and finishes the retry read operation.

Through the operation as described above, the retry read operation is finished.

1.2.4 LLR Table

Of the above-described retry read operations, the soft-decision bit decoding performed in step ST14 and the soft-decision bit decoding performed in step ST17 are different in the number of pages of data used in processing. For this reason, in step ST17 the ECC circuit 260 may apply an LLR table differing from the one used in step ST14. The LLR table applied in step ST17 is pre-stored in the RAM 220, along with the LLR table applied in step ST14.

First, the LLR table applied in the soft-decision bit decoding in step ST14 (namely the processing using the results SB1 and SB2 of the shift read operations SR(−Δ) and SR(+Δ)) will be explained with reference to FIG. 10.

The top portion of FIG. 10 illustrates the threshold voltage distributions, taking the threshold voltage as the horizontal axis, and the number of memory cells in a cell unit CU corresponding to a selected word line WLn as the vertical axis. The threshold voltage distributions show a case where the adjacent states, among the "Er" through "C" states, overlap. The middle portion of FIG. 10 illustrates a three-bit bit string that a set of the results HB, SB1, and SB2 may take when an upper page read operation is performed. The bottom portion of FIG. 10 shows the LLR associated with the bit strings. The above-described bit strings and LLRs are shown with a classification in accordance with a range under which the threshold voltage of a selected memory cell falls.

As shown in FIG. 10, in the operation HR, data "1" is read from a selected memory cell having a threshold voltage lower than the voltage VA or equal to or higher than the voltage VC, and data "0" is read from a selected memory cell having a threshold voltage equal to or higher than the voltage VA and lower than the voltage VC. In the operation SR(−Δ), data "1" is read from a selected memory cell having a threshold voltage lower than the voltage (VA−Δ) or equal to or higher than the voltage (VC−Δ), and data "0" is read from a selected memory cell having a threshold voltage equal to or higher than the voltage (VA−Δ) and lower than the voltage (VC−Δ). In the operation SR(+Δ), data "1" is read from a selected memory cell having a threshold voltage lower than the voltage (VA+Δ) or equal to or higher than the voltage (VC+Δ), and data "0" is read from a selected memory cell having a threshold voltage equal to or higher than the voltage (VA+Δ) and lower than the voltage (VC+Δ).

Thus, the bit string (HB, SB1, SB2) is classified into six patterns according to the threshold voltage of the selected memory cell, and the LLR corresponds to each of the six patterns. In the example shown in FIG. 10, if the threshold voltage of the selected memory cell is lower than the voltage (VA−Δ) or equal to or higher than the voltage (VC+Δ), the bit string (HB, SB1, SB2) is (111), and the LLR "−Na" corresponds thereto. If the threshold voltage of the selected memory cell is equal to or higher than the voltage (VA−Δ) and lower than the voltage VA (namely the range [1] shown in FIG. 10), the bit string (HB, SB1, SB2) is (101), and the LLR "−Nb" corresponds thereto. If the threshold voltage of the selected memory cell is equal to or higher than the voltage VA and lower than the voltage (VA+Δ) (namely the range [2] shown in FIG. 10), the bit string (HB, SB1, SB2) is (001), and the LLR "Nb1" corresponds thereto. If the threshold voltage of the selected memory cell is equal to or higher than the voltage (VA+Δ) and lower than the voltage (VC−Δ), the bit string (HB, SB1, SB2) is (000), and the LLR "Na" corresponds thereto. If the threshold voltage of the selected memory cell is equal to or higher than the voltage (VC−Δ) and lower than the voltage VC, the bit string (HEB, SB1, SB2) is (010), and the LLR "Nb" corresponds thereto. If the threshold voltage of the selected memory cell is equal to or higher than the voltage VC and lower than the voltage (VC+Δ), the bit string (HB, SB1, SB2) is (110), and the LLR "−Nb" corresponds thereto.

Herein, the selected memory cell from which the bit string (111) is read belonging to the "Er" state or the "C" state is more likely than the selected memory cell from which the bit string (101) or (110) is read belonging to the "Er" state or the "C" state. Furthermore, the selected memory cell from which the bit string (000) is read belonging to the "A" state or the "B" state is more likely than the selected memory cell from which the bit string (001) or (010) is read belonging to the "A" state or the "B" state. For this reason, "Na" is set at a larger value than "Nb" (Na>Nb).

The threshold voltage of the selected memory cell belonging to the "Er" state is prone to shift to a higher voltage side due to interference of an adjacent memory cell. For this reason, the likelihood that the selected memory cell (within the range [2] shown in FIG. 10) from which the bit string (001) is read belongs to the state "A" may be smaller than the likelihood that the selected memory cell (within the range [1] shown in FIG. 10) from which the bit string (101) is read belongs to the state "Er". For this reason, "Nb1" is set to a value equal to or smaller than a value of "Nb" (Nb1≤Nb).

Through the application of the above-described LLR table, it is possible to weight the likelihood of the data being read as appropriate in accordance with the amplitude of the threshold voltage of the selected memory cell when soft-decision bit decoding is performed in step ST14.

Next, the LLR table applied in the soft-decision decoding in step ST17 (namely, the decoding process using the result SB3 of the single-state read operation SSRnb in addition to the results SB2 and SB3 of the shift read operations SR(−Δ) and SR(+Δ)) will be described with reference to FIG. 11.

Figure 11:
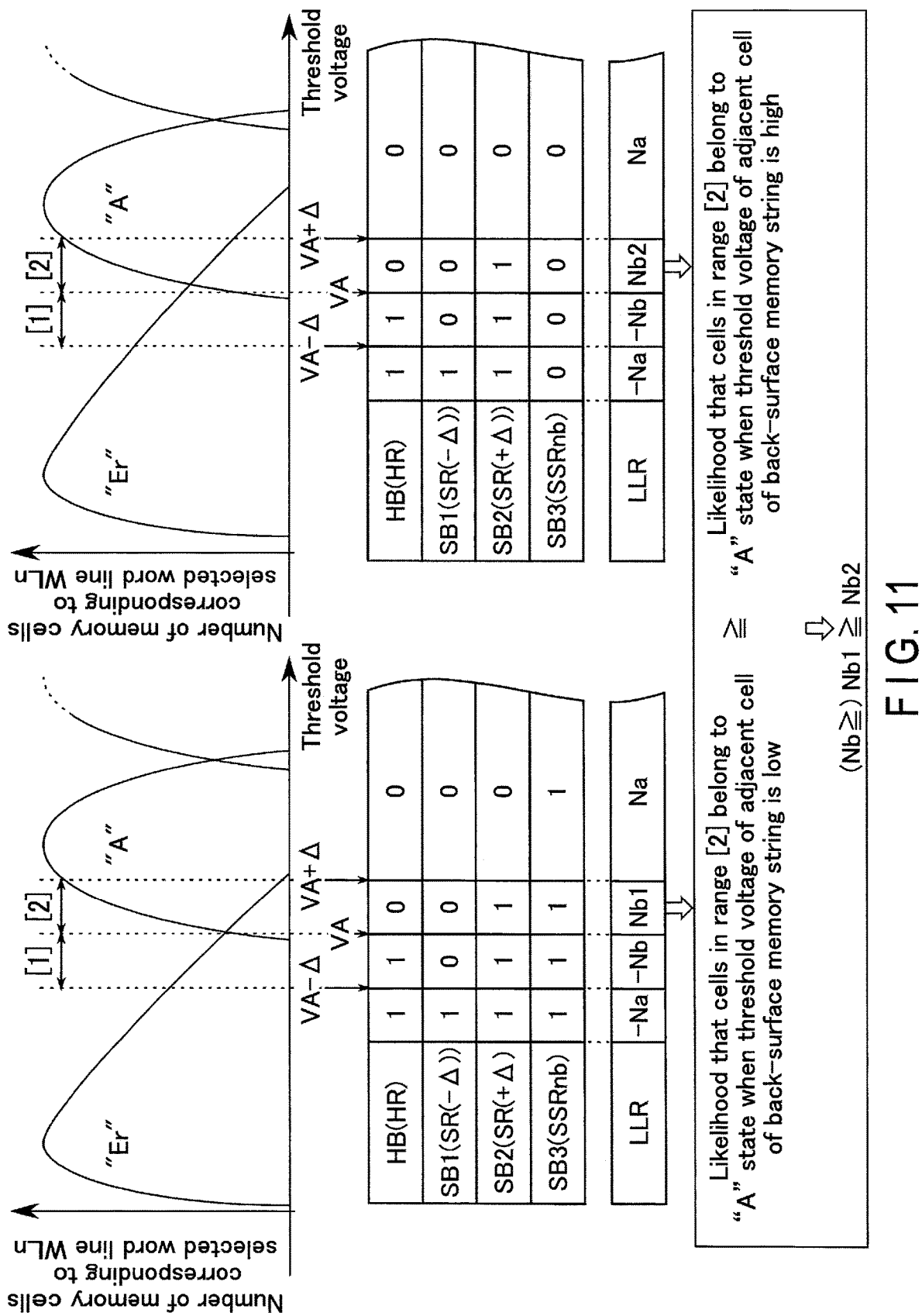
FIG. 11 is a schematic diagram for explaining an LLR table applied in soft-decision processing in the memory system according to the first embodiment.

In FIG. 11, the example shown in FIG. 10 is classified into two cases according to the amplitude of the threshold voltage of a memory cell formed in the same memory pillar MP as that to which the selected memory cell belongs in the cell unit CU corresponding to the word line WLnb (hereinafter, the memory cell may be referred to as a "back-surface side proximity memory cell"). In other words, the left portion of FIG. 11 shows the case where the threshold voltage of the back-surface side proximity memory cell is lower than the read voltage VSSRnb used in the single-state read operation SSRnb, and the right portion of FIG. 11 shows the case where the threshold voltage of the back-surface side proximity memory cell is higher than the read voltage VSSRnb.

Since the operations HR, SR(−Δ) and SR(+Δ) are the same as those shown in FIG. 10, as shown in FIG. 11, the descriptions thereof are omitted, and the operation SSRnB will be mainly described.

In the operation SSRnb, data "1" is read from the back-surface side proximity memory cell having a threshold voltage lower than the voltage VSSRnb, and data "0" is read from the back-surface side proximity memory cell having a threshold voltage equal to or higher than the voltage VSSRnb.

Thus, the bit string (HB, SB1, SB2, SB3) is classified into 12 patterns according to the threshold voltages of the selected memory cell and the back-surface side proximity memory cell, and each of the 12 patterns is associated with an LLR. In the example shown in FIG. 11, the same LLR as is shown in FIG. 10 is set regardless of the result SB3, except when the threshold voltage of the selected memory cell is equal to or higher than the voltage VA and lower than the voltage (VA+Δ) (the range [2] shown in FIG. 11). For this reason, in FIG. 11, the illustration of the case where the threshold voltage of the selected memory cell is higher than the voltage (VC−Δ) is omitted.

If the threshold voltage of the selected memory cell is equal to or higher than the voltage VA and lower than the voltage (VA+Δ), and the threshold voltage of the back-surface side proximity memory cell is lower than the voltage VSSRnb, the bit string (HB, SB1, SB2, SB3) is (0011), and the LLR "Nb1" corresponds thereto. If the threshold voltage of the selected memory cell is equal to or higher than the voltage VA and lower than the voltage (VA+Δ), and the threshold voltage of the back-surface side proximity memory cell is higher than the voltage VSSRnb, the bit string (HB, SB1, SB2, SB3) is (0010), and the LLR "Nb2" corresponds thereto.

Herein, the higher the threshold voltage of the back-surface side proximity memory cell, the more the threshold voltage of the selected memory cell is prone to shift to a higher voltage side due to interference from the back-surface side proximity memory cell. For this reason, the likelihood that the selected memory cell (within the range [2] shown in FIG. 11) corresponding to the bit string (0010) belongs to the state "A" may be smaller than the likelihood that the selected memory cell (within the range [2] shown in FIG. 11) corresponding to the bit string (0011) belongs to the state "A". For this reason, "Nb2" is set to a value equal to or smaller than a value of "Nb1" (Nb2≤Nb1).

Through the application of the above-described LLR table, it is possible to weight the likelihood of the data being read as appropriate in accordance with the amplitude of the threshold voltage of the selected memory cell when a soft-decision bit decoding is performed in step ST17.

1.3 Advantageous Effects of First Embodiment

According to the first embodiment, the memory system 1 reads data HB from a selected memory cell by a history read operation HR, and reads data SB1 and SB2 by shift read operations SR(−Δ) and SR(+Δ). The memory system 1 reads data SB3 from a back-surface side proximity memory cell by a single-state operation SSRnb. The ECC circuit 260 then performs soft-decision bit decoding using an LLR table including LLRs corresponding to sets of the bit string (HB, SB1, SB2, SB3). It is thereby possible to perform soft-decision bit decoding using different LLRs for the case where the threshold voltage of the back-surface side proximity memory cell is higher than the voltage VSSRnb and the case where the threshold voltage is lower than the voltage VSSRnb, when the threshold voltage of the selected memory cell is within a certain range. For this reason, the ECC circuit 260 can perform error correction processing taking the influence of the threshold voltage of a back-surface side proximity memory cell on a selected memory cell into account. Thus, it is possible to read data with consideration of the influence of a back-surface side proximity memory cell.

The RAM 220 pre-stores LLRs corresponding to sets of the bit string (HB, SB1, SB2, SB3), in addition to the LLRs corresponding to sets of the bit string (HB, SB1, SB2). It is thereby possible for the memory system 1 to additionally perform soft-decision bit decoding based on the bit string (HB, SB1, SB2, SB3), when hard-decision bit decoding, and soft-decision bit decoding based on the bit string (HB SB1, SB2) fail. For this reason, a single-state read operation SSRnb only needs to be performed when the soft-decision bit decoding based on the bit string (HB, SB1, SB2) fails, and a time required for performing a retry read operation can be adjusted in accordance with a frequency of error occurrence.

Furthermore, a single-state read operation SSRnb can be performed independently, regardless of other read results stored in latch circuits (not shown) in the sense amplifier 140. For this reason, it is possible to perform soft-decision bit decoding in consideration of the influence of a back-surface side proximity memory cell, without occupying multiple latch circuits in the sense amplifier 140. Thus, it is possible to perform soft-decision bit decoding in consideration of the influence of a back-surface side proximity memory cell, even in a situation where only a small number of unused latch circuits are available in the sense amplifier 140 (for example, a situation where a write operation is interrupted to perform a read operation).

2. Second Embodiment

Next, the memory system according to a second embodiment will be described. In the first embodiment, soft-decision bit decoding is performed by applying an LLR table in consideration of a result SB3 of a single-state read operation SSRnb corresponding to a word line WLnb in addition to results SB1 and SB2 of shift read operations SR(−Δ) and SR(+V) corresponding to a selected word line WLn. The second embodiment differs from the first embodiment in that soft-decision bit decoding is performed by applying an LLR table in which results SB4 and SB5 of single-state read operations SSR(n+1) and SSR (n−1) corresponding to word lines WL(n+1) and WL(n−1) are further considered in addition to the results HE and SB1 through SB3. Hereinafter, the same configurations and operations as those of the first embodiment will be omitted, and those differing from those of the first embodiment will be mainly described.

2.1 Retry Read Operation

Figure 12:
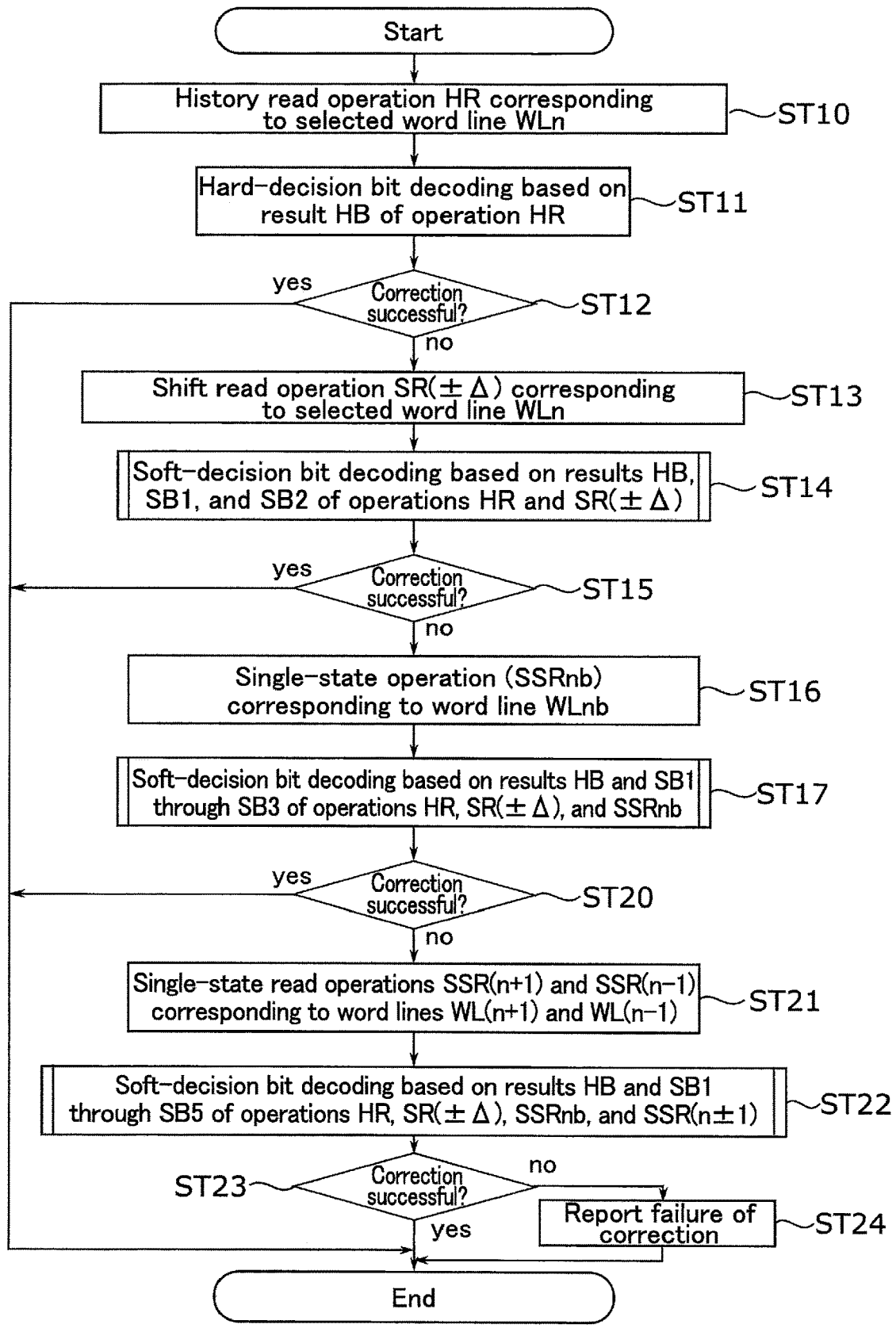
FIG. 12 is a flowchart for explaining a retry read operation in a memory system according to a second embodiment.

FIG. 12 is a flowchart for explaining a retry read operation in the memory system according to the second embodiment, and corresponds to FIG. 9 in the first embodiment.

As shown in FIG. 12, the steps in FIG. 12 further include steps ST20 through ST24 in addition to steps ST10 through ST17 explained in FIG. 9.

First, in steps ST10 through ST17, the memory system 1 performs processing similar to the processing in steps ST10 through ST17 in FIG. 9. After step ST17, the processing proceeds to step ST20.

In step ST20, if an error is corrected by the soft-decision bit decoding in step ST17 (Yes in ST20), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST20), the processing proceeds to step ST21.

In step ST21, the memory system 1 performs a single-state read operation SSR(n+1) on a cell unit CU corresponding to a word line WL(n+1), and a single-state read operation SSR(n−1) on a cell unit CU corresponding to a word line WL(n−1). Thus, the memory controller 200 obtains a read result SB4 of the single-state read operation SSR(n+1) and a read result SB5 of the single-state read operation SSR(n−1) from the NAND flash memory 100. In the operations SSR(n+1) and SSR(n−1), a voltage of a certain value may be applied to the word lines WL(n+1) and WL(n−1), for example, a read voltage VB.

In step ST22, the ECC circuit 260 performs soft-decision bit decoding based on the results HB, SB1, SB2, SB3, SB4, and SB5 of the operations HR, SR(−Δ), SR(+Δ), SSRnb, SSR(n+1), and SSR(n−1).

In step ST23, if an error is corrected by the soft-decision bit decoding in step ST22 (Yes in ST23), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST23), the processing proceeds to step ST24.

In step ST24, the memory controller 200 notifies the host apparatus 300 that the error cannot be corrected by the retry read operation, and finishes the retry read operation.

Through the operation as described above, the retry read operation is finished.

2.2 LLR Table

Of the above-described retry read operations, the soft-decision bit decoding performed in step ST22 differs from the soft-decision bit decoding performed in steps ST14 and ST17 described in the first embodiment in the number of pages of data used in processing. For this reason, in step ST22 the ECC circuit 260 may apply an LLR table differing from the one used in steps ST14 and ST17. The LLR table applied in step ST22 is pre-stored in the RAM 220.

The LLR table applied in the soft-decision bit decoding in step ST22 (namely the processing using the results SB4 and SB5 of the single-state read operations SSR(n+1) and SSR (n−1)) will be explained with reference to FIG. 13.

FIG. 13 shows an example wherein, the bit string (0011) set to "Nb1" as an LLR and the bit string (0010) set to "Nb2" shown in FIG. 11 of the first embodiment are further classified by the results SB4 and SB5. In the descriptions hereinafter, in the cell unit CU corresponding to the word line WL(n+1), a memory cell formed in the same memory string MS as a selected memory cell is referred to as a "bit-line side proximity memory cell". In the cell unit CU corresponding to the word line WL(n−1), a memory cell formed in the same memory string MS as a selected memory cell is referred to as a "source-line side proximity memory cell".

First, the classification based on the operation SSR(n+1) will be explained.

As shown in FIG. 13, in the operation SSR(n+1), data "1" is read from the bit-line side proximity memory cell having a threshold voltage lower than the voltage VSSR(n+1), and data "0" is read from the bit-line side proximity memory cell having a threshold voltage equal to or higher than the voltage VSSR(n+1). Thus, if the bit string (HB, SB1, SB2, SB3) is (0011), and the threshold voltage of the bit-line side proximity memory cell is lower than the voltage VSSR(n+1), then the bit string is associated with "Nb1" as an LLR, while if the threshold voltage is equal to or higher than the voltage VSSR(n+1), the bit string is associated with "Nb3" as an LLR. If the bit string (HB, SB1, SB2, SB3) is (0010), and the threshold voltage of the bit-line side proximity memory cell is lower than the voltage VSSR(n+1), then the bit string is associated with "Nb2" as an LLR, while if the threshold voltage is equal to or higher than the voltage VSSR(n+1), the bit string is associated with Nb4" as an LLR.

Herein, the higher the threshold voltage of a bit-line side proximity memory cell, the more the threshold voltage of the selected memory cell is prone to shift to a higher voltage side due to interference of the bit-line side proximity memory cell. For this reason, the likelihood that the selected memory cell corresponding to the bit string (00110) belongs to the state "A" may be smaller than the likelihood that the selected memory cell corresponding to the bit string (00111) belongs to the state "A". For this reason, "Nb3" is set to a value equal to or smaller than a value of "Nb1" (Nb3≤Nb1). Similarly, the likelihood that the selected memory cell corresponding to the bit string (00100) belongs to the state "A" may be smaller than the likelihood that the selected memory cell corresponding to the bit string (00101) belongs to the state "A". For this reason, "Nb4" is set to a value equal to or smaller than a value of "Nb2" (Nb4 S Nb2).

Furthermore, for example, the threshold voltage of the back-surface side proximity memory cell and the threshold voltage of the bit-line side proximity memory cell are comparable, and the back-surface side proximity memory cell may have a larger influence on the threshold voltage of the selected memory cell than the bit-line side proximity memory cell has. For this reason, the likelihood that the selected memory cell corresponding to the bit string (00101) belongs to the state "A" may be smaller than the likelihood that the selected memory cell corresponding to the bit string (00110) belongs to the state "A". For this reason, "Nb2" is set to a value equal to or smaller than a value of "Nb3" (Nb2≤Nb3).

Next, the classification based on the operation SSR(n−1) will be explained.

In the operation SSR(n−1), data "1" is read from the source-line side proximity memory cell having a threshold voltage lower than the voltage VSSR(n−1), and "data" 0" is read from the source-line side proximity memory cell having a threshold voltage equal to or higher than the voltage VSSR(n−1). Thus, if the bit string (HB, SB1, SB2, SB3, SB4) is (00111), and the threshold voltage of the source-line side proximity memory cell is lower than the voltage VSSR(n−1), then the bit string is associated with "Nb1" as an LLR, while if the threshold voltage is equal to or higher than the voltage VSSR(n−1), the bit string is associated with "Nb5" as an LLR. If the bit string (HB, SB1, SB2, SB3, SB4) is (00110), and the threshold voltage of the source-line side proximity memory cell is lower than the voltage VSSR(n−1), then the bit string is associated with "Nb3" as an LLR, while if the threshold voltage is equal to or higher than the voltage VSSR(n−1), the bit string is associated with "Nb7" as an LLR. If the bit string (HB, SB1, SB2, SB3, SB4) is (00101), and the threshold voltage of the source-line side proximity memory cell is lower than the voltage VSSR (n−1), then the bit string is associated with "Nb2" as an LLR, while if the threshold voltage is equal to or higher than the voltage VSSR(n−1), the bit string is associated with "Nb6" as an LLR. If the bit string (HB, SB1, SB2, SB3, SB4) is (00100), and the threshold voltage of the source-line side proximity memory cell is lower than the voltage VSSR (n−1), then the bit string is associated with "Nb4" as an LLR, while if the threshold voltage is equal to or higher than the voltage VSSR(n−1), the bit string is associated with "Nb8" as an LLR.

Herein, the higher the threshold voltage of a source-line side proximity memory cell, the more the threshold voltage of the selected memory cell is prone to shift to a higher voltage side due to interference of the source-line side proximity memory cell. For this reason, the likelihood that the selected memory cell corresponding to the bit string (001110) belongs to the state "A" may be smaller than the likelihood that the selected memory cell corresponding to the bit string (001111) belongs to the state "A". For this reason, "Nb5" is set to a value equal to or smaller than a value of "Nb1" (Nb5≤Nb1). The likelihood that the selected memory cell corresponding to the bit string (001100) belongs to the state "A" may be smaller than the likelihood that the selected memory cell corresponding to the bit string (001101) belongs to the state "A". For this reason, "Nb7" is set to a value equal to or smaller than a value of "Nb3" (Nb7 ≤ Nb3). For this reason, the likelihood that the selected memory cell corresponding to the bit string (001010) belongs to the state "A" may be smaller than the likelihood that the selected memory cell corresponding to the bit string (001011) belongs to the state "A". For this reason, "Nb6" is set to a value equal to or smaller than a value of "Nb2" (Nb6 ≤ Nb2). The likelihood that the selected memory cell corresponding to the bit string (001000) belongs to the state "A" may be smaller than the likelihood that the selected memory cell corresponding to the bit string (001001) belongs to the state "A". For this reason, "Nb8" is set to a value equal to or smaller than a value of "Nb4" (Nb8 ≤ Nb4).

For example, if the threshold voltage of the bit-line side proximity memory cell and the threshold voltage of the source-line side proximity memory cell are comparable, there is no significant differences in an influence on the threshold voltage of the selected memory cell between the bit-line side proximity memory cell and the source-line side proximity memory cell has. For this reason, when the bit strings (HB, SB1, SB2, SB3) are equal, the LLR set if the bit string (SB4, SB5) is (01) and the LLR set if the bit string is (10) may be equal.

The above-described relationships of the LLRs can be summarized as Nb8≤Nb6=Nb4≤Nb2≤Nb7≤Nb5= Nb3≤Nb1≤Nb. Through the application of the above-described LLR table, it is possible to weight the likelihood of the data being read from the selected memory cell as appropriate in accordance with the amplitude of the threshold voltages of the back-surface side proximity memory cell, the bit-line side proximity memory cell, and the source-line side proximity memory cell when a soft-decision bit decoding is performed in step ST22.

2.3 Advantageous Effects of Second Embodiment

According to the second embodiment, the memory system 1 reads data SB4 from a bit-line side proximity memory cell by a single-state read operation SSR(n+1), and reads data SB5 from a source-line side proximity memory cell by a single-state read operation SSR(n−1). The ECC circuit 260 performs soft-decision bit decoding using an LLR table including LLRs corresponding to a set of patterns of the bit string (HEB, SB1, SB2, SB3, SB4, SB5). It is thereby possible to perform soft-decision bit decoding using different LLRs in further consideration of the influences of the bit-line side proximity memory cell and the source-line side proximity memory cell, in addition to the influence of the back-surface side proximity memory cell, when the threshold voltage of the selected memory cell is within a certain range.

The RAM 220 pre-stores LLRs corresponding to a set of patterns of the bit string (HB, SB1, SB2, SB3, SB4, SB5), in addition to the LLRs corresponding to a set of patterns of the bit string (HB, SB1, SB2, SB3). It is thereby possible for the memory system 1 to additionally perform soft-decision bit decoding based on the bit string (HB, SB1, SB2, SB3, SB4, SB5) when soft-decision bit decoding on the bit string (HB, SB1, SB2, SB3) fails. For this reason, single-state read operations SSR(n+1) and SSR(n−1) only need to be performed when the soft-decision bit decoding based on the bit string (HEB, SB1, SB2, SB3) fails, and a time required for performing a retry read operation can be adjusted in accordance with a frequency of error occurrence.

3. Third Embodiment

Next, the memory system according to a third embodiment will be described. The third embodiment differs from the second embodiment in that soft-decision bit decoding is performed through applying an LLR table in further consideration of a result SB6 of a single-state read operation SSRnb_2 corresponding to a word line WLnb in addition to the results HB and SB1 through SB5.

Hereinafter, the same configurations and operations as those of the second embodiment will be omitted, and those differing from those of the second embodiment will be mainly described.

3.1 Retry Read Operation

Figure 14:
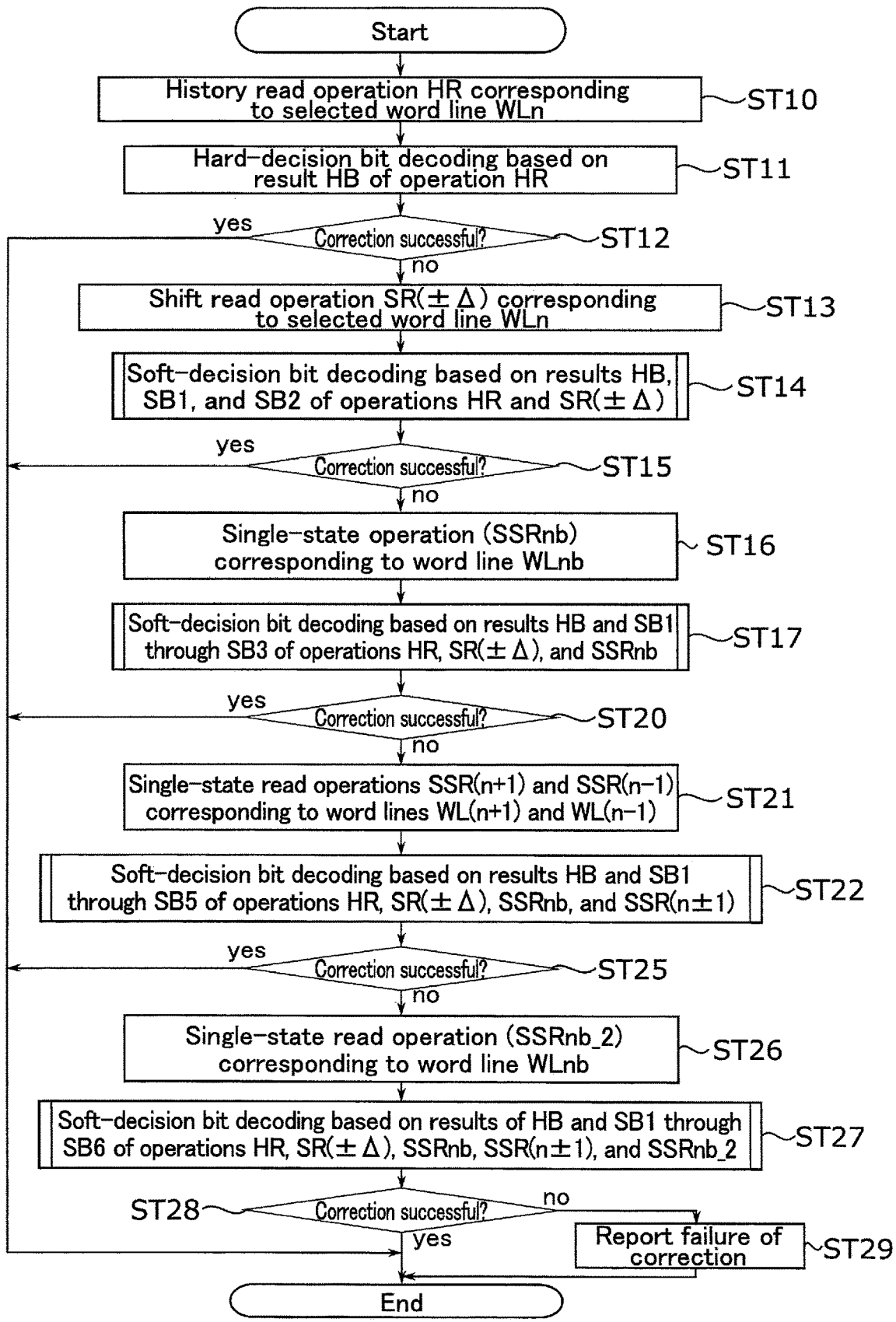
FIG. 14 is a flowchart for explaining a retry read operation in a memory system according to a third embodiment.

FIG. 14 is a flowchart for explaining a retry read operation in the memory system according to the third embodiment, and corresponds to FIG. 12 in the second embodiment.

As shown in FIG. 14, the steps in FIG. 14 further include steps ST25 through ST29 in addition to steps ST10 through ST17 and steps ST20 through ST22 explained in FIG. 12.

First, in steps ST10 through ST17 and steps ST20 through ST22, the memory system 1 performs processing similar to the processing in steps ST10 through ST17 and steps ST20 though ST22 in FIG. 12. After step ST22, the processing proceeds to step ST25.

In step ST25, if an error is corrected by the soft-decision bit decoding in step ST22 (Yes in ST25), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST25), the processing proceeds to step ST26.

In step ST26, the memory system 1 performs the single-state read operation SSRnb_2 on the cell unit CU corresponding to the word line WLnb. The read voltage VSSRnb_2 applied to a back-surface side proximity memory cell in the single-state read processing SSRnb_2 is higher than the read voltage VSSRnb applied to a back-surface side proximity memory cell in the single-state read processing SSRnb (VSSRnb_2>VSSRnb). In the operation SSRnb_2, a voltage of a certain value higher than the voltage VSSRnb may be applied to the word line WLnb; for example, a read voltage VC.

Thus, the memory controller 200 obtains a read result SB6 by the single-state read operation SSRnb_2 from the NAND flash memory 100.

In step ST27, the ECC circuit 260 performs soft-decision bit decoding based on the results HB, SB1, SB2, SB3, SB4, SB5, and SB6 of the operations HR, SR(−Δ), SR(+Δ), SSRnb, SSR(n+1), SSR(n−1), and SSRnb_2.

In step ST28, if an error is corrected by the soft-decision bit decoding in step ST27 (Yes in ST28), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST28), the processing proceeds to step ST29.

In step ST29, the memory controller 200 notifies the host apparatus 300 that the error cannot be corrected by the retry read operation, and finishes the retry read operation.

Through the operation as described above, the retry read operation is finished.

3.2 LLR Table

In the above-described retry read operation, the number of pages of data used in processing is different between the soft-decision bit decoding performed in step ST27 and the soft-decision bit decoding performed in steps ST14, ST17, and ST22 described in the second embodiment. For this reason, in step ST27 the ECC circuit 260 may apply an LLR table differing from the one used in steps ST14, ST17, and ST22. The LLR table applied in step ST27 is pre-stored in the RAM 220.

The LLR table applied in the soft-decision bit decoding in step ST27 (namely the processing using the result SB6 of the single-state read operation SSRnb_2) will be explained with reference to FIG. 15.

FIG. 15 shows an example wherein the bit strings shown in FIG. 13 of the second embodiment for which the threshold voltage of the back-surface side memory cell is determined to be equal to or higher than the voltage VSSRnb (namely, the result SB3 is "0") are further classified according to the result SB6.

As shown in FIG. 15, in the operation SSRnb_2, data "1" is read from the back-surface side proximity memory cell having a threshold voltage lower than the voltage VSSRnb_2, and data "0" is read from the back-surface side proximity memory cell having a threshold voltage equal to or higher than the voltage VSSRnb_2. Thus, if the bit string (HB, SB1, SB2, SB3, SB4, SB5) is (001011), the threshold voltage of the back-surface side proximity memory cell is lower than the voltage VSSRnb_2, the bit string is associated with "Nb2" as an LLR, and if the threshold voltage is equal to or higher than the voltage VSSRnb_2, the bit string is associated with "Nb9" as an LLR. If the bit string (HB, SB1, SB2, SB3, SB4, SB5) is (001010), the threshold voltage of the source-line side proximity memory cell is lower than the voltage VSSRnb_2, the bit string is associated with "Nb6" as an LLR, and if the threshold voltage is equal to or higher than the voltage VSSRnb_2, the bit string is associated with "Nb10" as an LLR. If the bit string (HB, SB1, SB2, SB3, SB4, SB5) is (001001), the threshold voltage of the source-line side proximity memory cell is lower than the voltage VSSRnb_2, the bit string is associated with "Nb4" as an LLR, and if the threshold voltage is equal to or higher than the voltage VSSRnb_2, the bit string is associated with "Nb11" as an LLR. If the bit string (HB, SB1, SB2, SB3, SB4, SB5) is (001000), the threshold voltage of the source-line side proximity memory cell is lower than the voltage VSSRnb_2, the bit string is associated with "Nb8" as an LLR, and if the threshold voltage is equal to or higher than the voltage VSSRnb_2, the bit string is associated with "Nb12" as an LLR.

Herein, the higher the threshold voltages of the back-surface side proximity memory cell, the bit-line side proximity memory cell, and the source-line side proximity memory cell, the more the threshold voltage of the selected memory cell is prone to shift to a higher voltage side. For this reason, the likelihood that the selected memory cell corresponding to the bit string (0010000) belongs to the state "A" may be smaller than the likelihood that the selected memory cells corresponding to the bit strings (0010010) and (0010100) belong to the state "A". For this reason, "Nb12" is set to a value equal to or smaller than the values of "Nb10" and "Nb11" (Nb12≤Nb10, Nb12≤Nb11).

For this reason, the likelihood that the selected memory cell corresponding to the bit strings (0010010) and (0010100) belongs to the state "A" may be smaller than the likelihood that the selected memory cell corresponding to the bit string (0010110) belongs to the state "A". For this reason, "Nb10" and "Nb11" are set to values equal to or smaller than a value of "Nb9" (Nb10 S Nb9, Nb11 S Nb9).

As described above, if the threshold voltage of the bit-line side proximity memory cell and the threshold voltage of the source-line side proximity memory cell are comparable, there is no significant differences in an influence on the threshold voltage of the selected memory cell between the bit-line side proximity memory cell and the source-line side proximity memory cell has. For this reason, the likelihood that the selected memory cell corresponding to the bit string (0010100) belongs to the state "A" may be equal to the likelihood that the selected memory cell corresponding to the bit string (0010010) belongs to the state "A". For this reason, "Nb10" is set to a value equal to a value of "Nb11" (Nb10=Nb11).

In the third embodiment, as an example, suppose the influence imposed on the threshold voltage of a selected memory cell is higher if the threshold voltage of the back-surface side proximity memory cell is equal to or higher than the voltage VSSRnb_2 than that if the threshold voltages of the bit-line side proximity memory cell and the source-line proximity memory are equal to or higher than the voltages VSSR(n+1) and VSSR(n−1), respectively. If so, the likelihood that the selected memory cell corresponding to the bit string (0010110) belongs to the state "A" may be smaller than the likelihood that the selected memory cell corresponding to the bit string (0010001) belongs to the state "A". For this reason, "Nb9" is set to a value equal to or smaller than a value of "Nb8" (Nb9 S Nb8).

The above-described relationships of the LLRs can be summarized as Nb12 Nb11=Nb10≤Nb9 S Nb8≤Nb6=Nb4 Nb2 s Nb7 S Nb5=Nb3 S Nb1 S Nb. Through the application of the above-described LLR table as described above, when soft-decision bit decoding is performed in step ST27, it is possible to appropriately weight the likelihood of the data being read from the selected memory cell in accordance with the amplitude of the threshold voltages of the back-surface side proximity memory cell, the bit-line side proximity memory cell, and the source-line side proximity memory cell.

3.3 Advantageous Effects of Third Embodiment

According to the third embodiment, the memory system 1 reads data SB6 from a back-surface side proximity memory cell by a single-state operation SSRnb_2. The ECC circuit 260 then performs soft-decision bit decoding using an LLR table including LLRs corresponding to sets of the bit string (HB, SB1, SB2, SB3, SB4, SB5, SB6). It is thereby possible to consider the influence of the threshold voltage of a back-surface side proximity memory cell on a selected memory cell in three cases: where the threshold voltage is (1) lower than the voltage VSSRnb, (2) equal to or higher than the voltage VSSRnb and lower than the voltage VSSRnb_2, and (3) equal to or higher than the voltage VSSRnb_2.

The RAM 220 pre-stores LLRs corresponding to the sets of the bit string (HB, SB1, SB2, SB3, SB4, SB5, SB6), in addition to the LLRs corresponding to the sets of the bit string (HB, SB1, SB2, SB3, SB4, SB5). It is thereby possible for the memory system 1 to additionally perform soft-decision bit decoding based on the bit string (HB, SB1, SB2, SB3, SB4, SB5, SB6), when soft-decision bit decoding on the bit string (HEB, SB1, SB2, SB3, SB4, SB5) fails. For this reason, a single state read operation SSRnb_2 only needs to be performed when soft-decision bit decoding based on the bit string (EB, SB1, SB2, SB3, SB4, SB5) fails, and a time required for performing a retry read operation can be adjusted in accordance with frequency of error occurrence.

4. Fourth Embodiment

Next, the memory system according to a fourth embodiment will be described.

In the first through third embodiments, examples in which all the read data is applied to the soft-decision bit decoding are described. The fourth embodiment differs from the first through third embodiments in that the read data is partially extracted and re-generated as data to be applied in soft-decision bit decoding. Hereinafter, the same configurations and operations as those of the third embodiment will be omitted, and those differing from those of the third embodiment will be mainly described.

4.1 Retry Read Operation

Figure 16:
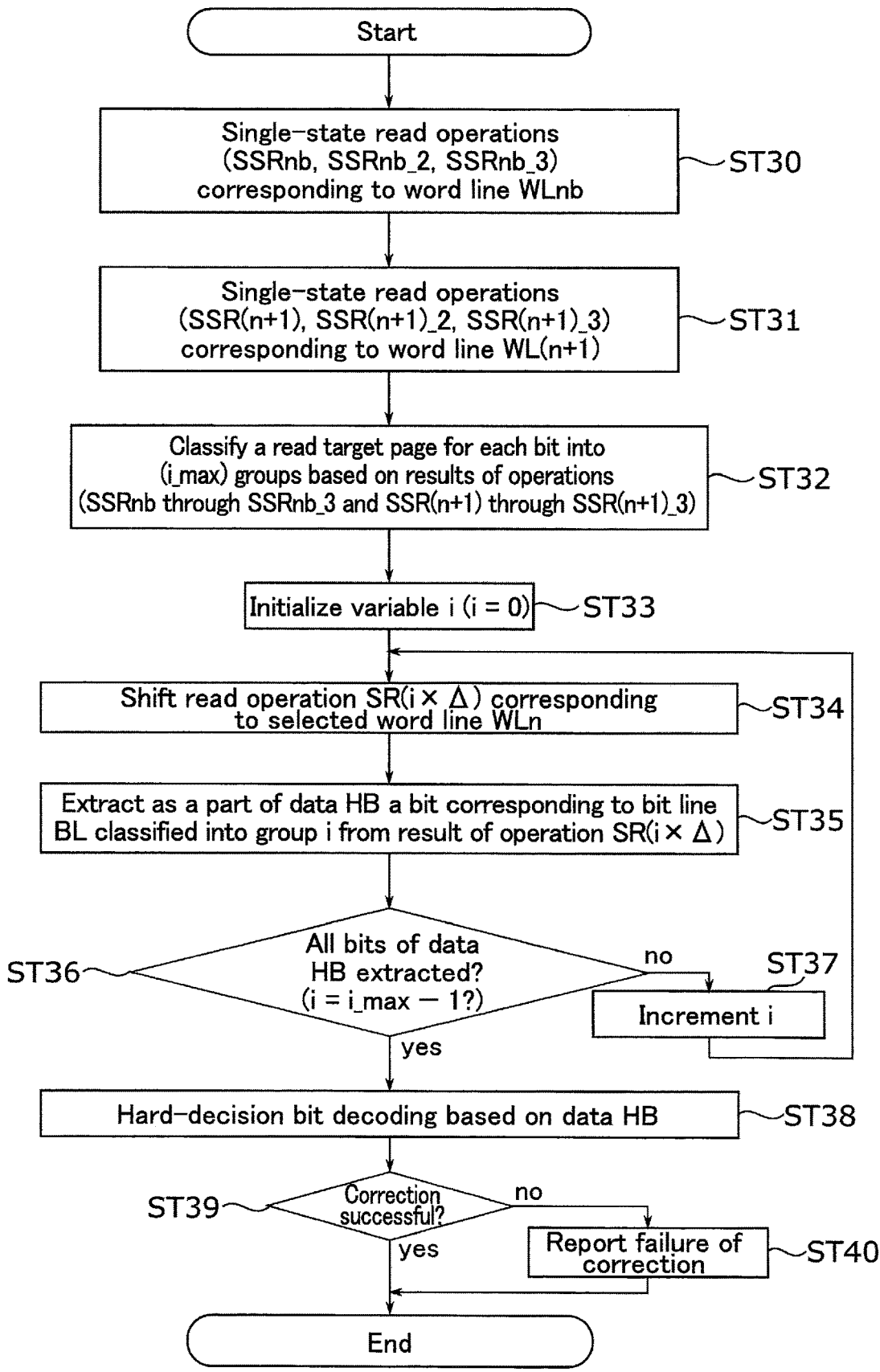
FIG. 16 is a flowchart for explaining a retry read operation in a memory system according to a fourth embodiment.

FIG. 16 is a flowchart for explaining the retry read operation in the memory system according to the fourth embodiment.

As shown in FIG. 16, in step ST30, the memory system 1 performs the single-state read operation SSR three times (SSRnb, SSRnb_2, and SSRnb_3) on a cell unit CU corresponding to the selected word line WLnb. The read voltage VSSRnb_3 applied to a back-surface side proximity memory cell in the single-state read operation SSRnb_3 is lower than the read voltage VSSRnb applied to a back-surface side proximity memory cell in the single-state read processing SSRnb (VSSRnb_3<VSSRnb (<VSSRnb_2)). For example, the voltages VSSRnb_2, VSSRnb, and VSSRnb_3 may be the voltages VC, VB, and VA, respectively. Thus, the memory controller 200 classifies a read target page for each bit into four cases: where the threshold voltage of the back-surface side proximity memory cell is (1) lower than the voltage VA, (2) equal to or higher than the voltage VA and lower than the voltage VB, (3) equal to or higher than the voltage VB and lower than the voltage VC, and (4) equal to or higher than the voltage VC.

In step ST31, the memory system 1 performs the single-state read operation SSR three times (SSR(n+1), SSR(n+1)_2, and SSR(n+1)_3) on the cell unit CU corresponding to the word line WL(n+1). The read voltage VSSR(n+1)_2 applied to a bit-line side proximity memory cell in the single-state read operation SSR(n+1)_2 is higher than the read voltage VSSR(n+1) applied to a bit-line side proximity memory cell in the single-state read operation SSR(n+1) (VSSR(n+1)<VSSR(n+1)_2. The read voltage VSSR(n+1)_3 applied to a bit-line side proximity memory cell in the single-state read operation SSR(n+1)_3 is lower than the read voltage VSSR(n+1) applied to a bit-line side proximity memory cell in the single-state read operation SSR(n+1) (VSSR(n+1)_3<VSSR(n+1) (<VSSR(n+1)_2). For example, the voltages VSSR(n+1)_2, VSSR(n+1), and VSSR(n+1)_3 may be the voltages VC, VB, and VA, respectively. Thus, the memory controller 200 classifies a read target page for each bit into four cases: where the threshold voltage of the back-surface side proximity memory cell is (1) lower than the voltage VA, (2) equal to or higher than the voltage VA and lower than the voltage VB, (3) equal to or higher than the voltage VB and lower than the voltage VC, and (4) equal to or higher than the voltage VC.

In step ST32, the memory controller 200 classifies a read target page for each bit into any one of (i_max) groups based on the results obtained in steps ST30 and ST31. The number (i_max) is any integer equal to or greater than 3 and equal to or smaller than a product of the number of cases into which the read target page is classified in step ST31 and the number of cases into which the read target page is classified in step ST32. In other words, in the example shown in FIG. 16, (i_max) may be an integer equal to or greater than 3 and equal to or smaller than 16.

In step ST33, the memory controller 200 initializes the variable i to "0" (i=0). In the present embodiment, the variable i is an integer equal to or greater than 0 and equal to or smaller than (i_max−1) (0≤i≤(i_max−1).

In step ST34, the memory system 1 performs a shift read operation SR(i×Δ) on a cell unit CU corresponding to the selected word line WLn. For example, if i=0, the memory system 1 performs a history read operation HR that does not cause the read voltages to shift.

In step ST35, the memory controller 200 extracts, as a part of the data HB, a bit classified into an i-th group (group i) in step ST32 from the data read in step ST34. The data HB is one page of data input into the ECC circuit 260 as data used for hard-decision bit decoding.

In step ST36, the memory controller 200 determines whether or not all the bits of the data HB have been extracted (whether or not i=(i_max−1). If it is determined that all the bits of the data HB have been extracted (i=(i_max−1) (Yes in step ST36), the processing proceeds to step ST38. On the other hand, if it is determined that not all the bits of the data HB have been extracted (i<(i_max−1)) (No in step ST36), the processing proceeds to step ST37.

In step ST37, the memory controller 200 increments the variable i, and thereafter the processing returns to step ST34. In other words, the memory system 1 iterates the processing from step ST33 to step ST37 until all the bits of the data HB are extracted (namely, the variable i=(i_max−1)). It is thereby possible for the memory controller 200 to generate one page of data HB from i_max pages of data by a shift-read operation performed i_max times.

In step ST38, the ECC circuit 260 performs hard-decision bit decoding based on the data HB generated from the extracted bits.

In step ST39, if an error is corrected by the hard-decision bit decoding in step ST38 (Yes in step ST39), the memory controller 200 returns the error-corrected read data based on the hard-decision bit decoding to the host apparatus 300, and finishes the retry read operation. On the other hand, if an error cannot be corrected because the number of error bits exceeds the number of correctable error bits for the hard-decision bit decoding (No in step ST39), the processing proceeds to step ST40.

In step ST40, the memory controller 200 notifies the host apparatus 300 that the error cannot be corrected by the retry read operation, and finishes the retry read operation.

Through the operation as described above, the retry read operation is finished.

4.2 Classification

Next, the processing (classification) of classifying a read target page for each bit in step ST32 of FIG. 16 will be described with reference to FIG. 17.

Figure 17:
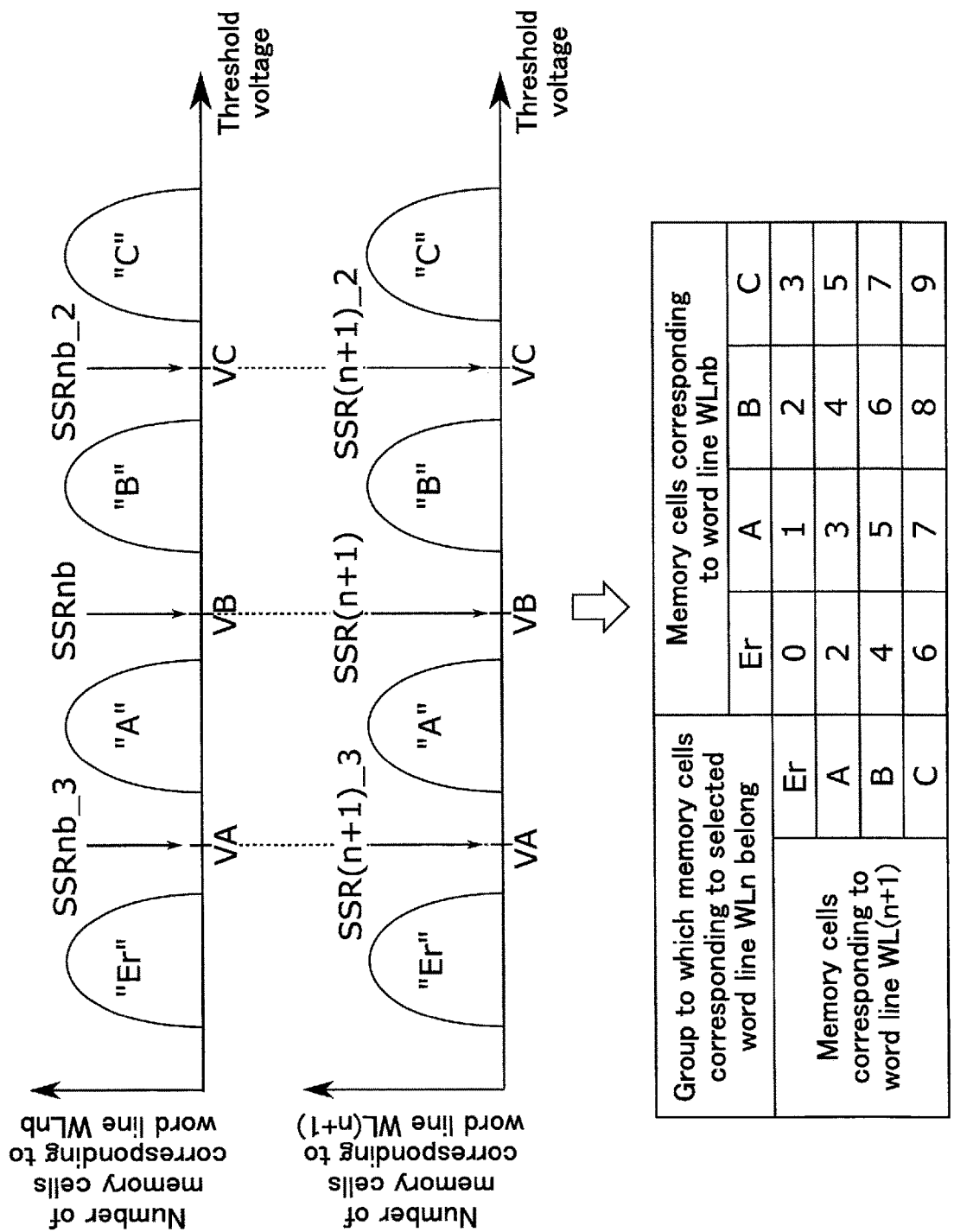
FIG. 17 is a schematic diagram for explaining a table applied in classification processing in the memory system according to the fourth embodiment.

FIG. 17 is a schematic diagram for explaining a table applied in the classification processing in the memory system according to the fourth embodiment.

As shown in FIG. 17, a selected memory cell is classified for each bit by the three single-state read operations SSRnb through SSRnb_3 in step ST 30 shown in FIG. 16 into four cases: where the threshold voltage of the back-surface side memory cell is (1) lower than the voltage VA ("Er" state), (2) equal to or higher than the voltage VA and lower than the voltage VB ("A" state), (3) equal to or higher than the voltage VB and lower than the voltage VC ("B" state), and (4) equal to or higher than the voltage VC ("C" state). Furthermore, a selected memory cell is classified for each bit by the three single-state read operations SSRnb through SSRnb_3 in step ST31 shown in FIG. 31 into four cases: where the threshold voltage of the bit-line side memory cell is (1) lower than the voltage VA ("Er" state), (2) equal to or higher than the voltage VA and lower than the voltage VB ("A" state), (3) equal to or higher than the voltage VB and lower than the voltage VC ("B" state), and (4) equal to or higher than the voltage VC ("C" state). Since the classification in step ST30 and the classification in step ST31 are mutually independent, it is possible to classify a selected memory cell into (4×4=) 16 combinations if those classifications are combined.

FIG. 17 shows an example in which the 16 combinations are classified into 10 groups. In other words, if the combination of states of a back-surface side memory cell and a bit-line side memory cell of a selected memory cell is expressed as (○, △), the relationship between the combination and the group into which the selected memory cell is classified is as follows (○ and △ represent the states the back-surface side memory cell and the bit-line side memory cell belong to respectively):

Group 0: <Er, Er>
Group 1: <A, Er>
Group 2: <B, Er> or <Er, A>
Group 3: <C, Er> or <A, A>
Group 4: <Er, B> or <B, A>
Group 5: <A, B> or <C, A>
Group 6: <Er, C> or <B, B>
Group 7: <A, C> or <C, B>
Group 8: <B, C>
Group 9: <C, C>

With the above-described classification, it is possible to associate the numeric value of the group number with the amplitude of the influence received from an adjacent memory cell on the assumption that the influence of the back-surface side memory cell on the threshold voltage of a selected memory cell is higher than that of the bit-line side memory cell.

4.3 Extraction

Next, the extraction of bits in step ST35 in FIG. 16 will be described with reference to FIG. 18.

FIG. 18 schematically shows how the bits in the data HB are extracted based on the above-described 10 groups for each bit. The example of FIG. 18 shows 16 bits (corresponding to bit lines BL0 through BL15) in a read target page. Each of the 16 bits corresponds to a set of a back-surface side memory cell and a bit-line side memory cell, which are in different states. The relationships between the bit line, the set of a back-surface side memory cell and a bit-line side memory cell, and the group into which the bit is classified are as follows:

BL0: <Er, Er> (Group 0)
BL1: <A, Er> (Group 2)
BL2: <B, Er> (Group 4)
BL3: <C, Er> (Group 6)
BL4: <Er, A> (Group 1)
BL5: <A, A> (Group 3)
BL6: <B, A> (Group 5)
BL7: <C, A> (Group 7)
BL8: <Er, B> (Group 2)
BL9: <A, B> (Group 4)
BL10: <B, B> (Group 6)
BL11: <C, B> (Group 8)
BL12: <Er, C> (Group 3)
BL13: <A, C> (Group 5)
BL14: <B, C> (Group 7)
BL15: <C, C> (Group 9)

If i=0, when data corresponding to Group 0 is read by a shift read operation SR(0Δ) in step ST34, the memory controller 200 extracts from the data a bit corresponding to the bit line BL0 classified into Group 0 "$*_{0,0}$" as a part of the data HB in step ST35.

If i=1, when data corresponding to Group 1 is read by a shift read operation SR(1Δ) in step ST34, the memory controller 200 extracts from the data a bit corresponding to the bit line BL4 classified into Group 1 "$*_{1,4}$" as a part of the data HB in step ST35.

If i=2, when data corresponding to Group 1 is read by a shift read operation SR(2Δ) in step ST34, the memory controller 200 extracts from the data a bit corresponding to the bit line BL1 and a bit corresponding to the bit line BL8 classified into Group 2, "$*_{2,1}$" and "$*_{2,8}$", as a part of the data HB in step ST35.

The extraction process is iterated up to i=9 in a similar manner. Thus, one page of data. HB is generated from the results of ten of the shift read operations, SR(0Δ) through SR(9Δ) (namely, 10 pages of data read by mutually different read voltages).

4.4. Advantageous Effects of Fourth Embodiment

According to the fourth embodiment, the memory system 1 classifies each bit of a read target page into 10 groups by three single-state read operations SSRnb through SSRnb_3 on a back-surface side proximity memory cell and three single-state read operations SSR(n+1) through SSR(n+1)_3 on a bit-line side proximity memory cell. The memory system 1 performs, on a selected memory cell, shift read operations SR(0Δ) through SR(9Δ) respectively corresponding to 10 groups into which a bit is classified. The memory controller 200 extracts a bit classified into Group i from the data read by a shift read operation SR(iΔ), and generates one page of the data HB. The ECC circuit 260 performs hard-decision bit decoding based on data HB. It is thereby possible to apply a bit that is read with a use of an optimal shift amount (0Δ through 9Δ) in hard-decision bit decoding for each bit and to improve the accuracy of error correction.

5. Fifth Embodiment

Next, the memory system according to the fifth embodiment will be described.

In the fourth embodiment, the case where the read data is partially extracted and one page of data is re-generated as data to be applied in hard-decision bit decoding. The fifth embodiment differs from the fourth embodiment in that the read data is partially extracted and multiple pages of data to be applied in soft-decision bit decoding is regenerated. Hereinafter, the same configurations and operations as those of the fourth embodiment will be omitted, and those differing from those of the fourth embodiment will be mainly described.

5.1 Retry Read Operation

Figure 19:
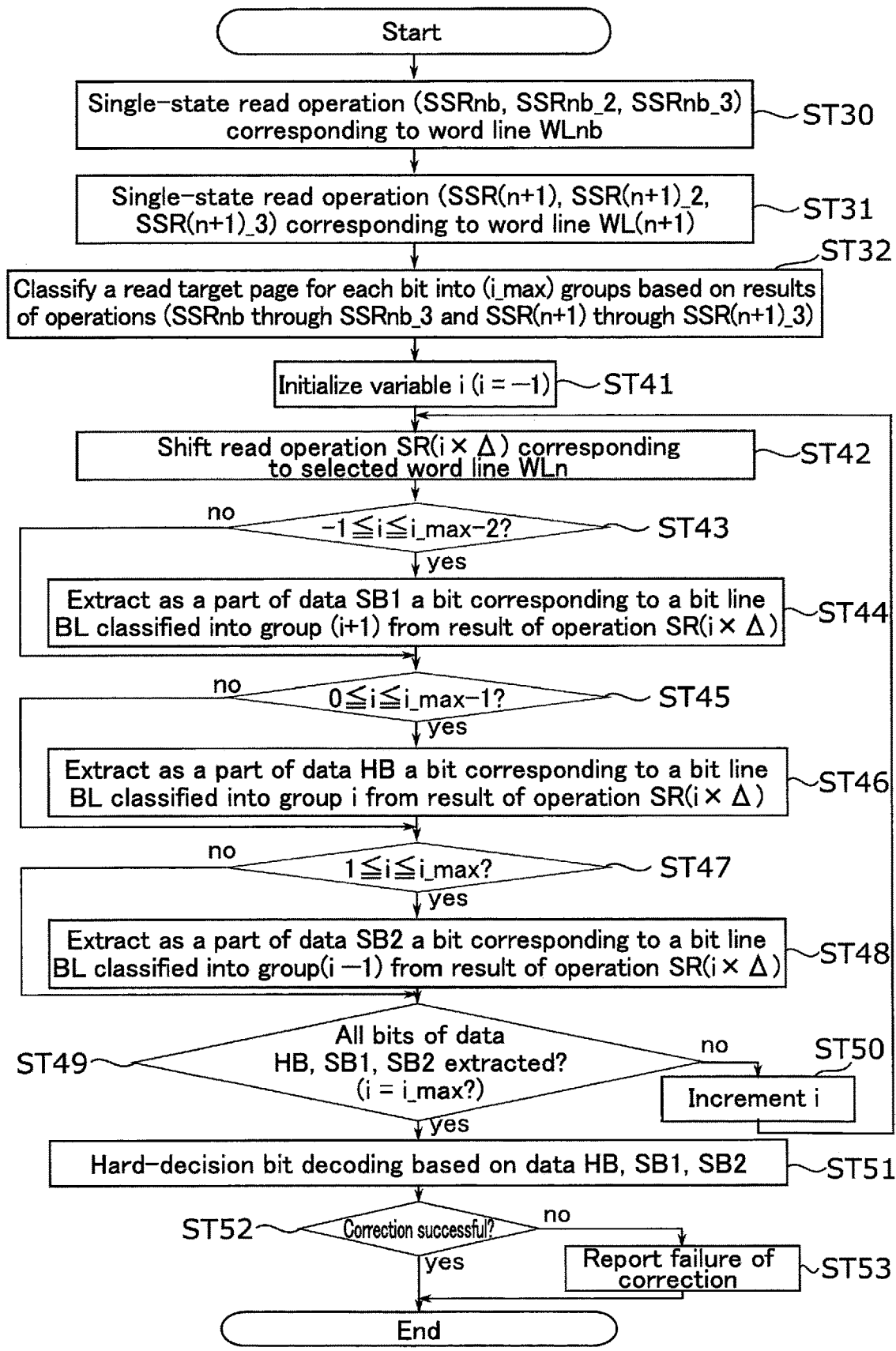
FIG. 19 is a flowchart for explaining a retry read operation in a memory system according to a fifth embodiment.

FIG. 19 is a flowchart for explaining a retry read operation in the memory system according to the fifth embodiment, and corresponds to FIG. 16 in the fourth embodiment.

As shown in FIG. 19, in steps ST30 through ST32, the memory system 1 performs single-state read operations SSRnb through SSRnb_3 and SSR(n+1) through SSR(n+1)_3, and classifies a read target page into (i_max) (=10) groups for each bit. In other words, the description of steps ST30 to ST32, which are the same as steps ST30 to ST32 of FIG. 16, will be omitted.

In step ST41, the memory controller 200 initializes the variable i to "−1" (i=−1). In the present embodiment, the variable i is an integer equal to or greater than −1 and equal to or smaller than (i_max) (−1≤i≤(i_max)).

In step ST42, the memory system 1 performs a shift read operation SR(i×Δ) on a cell unit CU corresponding to the selected word line WLn. For example, if i=−1, the memory system 1 performs a history read operation SR(−1Δ) in which the read voltages are shifted by −Δ.

In step ST43, the memory controller 200 determines whether or not the variable i is equal to or greater than −1 and equal to or smaller than (i_max−2). If −1≤i≤(i_max−2) (Yes in step ST43), the processing proceeds to step ST44, and if i=(i_max−1) or i_max (No in step ST43), the processing skips step ST44 and proceeds to step ST45.

In step ST44, the memory controller 200 extracts, as a part of the data SB1, a bit classified into a (i+1)-th group (group (i+1)) in step ST32 from the data read in step ST42. The data SB1 is one page of data input into the ECC circuit 260 as data used for soft-decision bit decoding.

In step ST45, the memory controller 200 determines whether or not the variable i is equal to or greater than 0 and equal to or smaller than (i_max−1). If 0≤i≤(i_max−1) (Yes in step ST45), the processing proceeds to step ST46, and if i=−1 or (i_max) (No in step ST45), the processing skips step ST46 and proceeds to step ST47.

In step ST46, the memory controller 200 extracts, as a part of the data HB, a bit classified into a i-th group (Group i) in step ST32 from the data read in step ST42.

In step ST47, the memory controller 200 determines whether or not the variable i is equal to or greater than 1 and equal to or smaller than i_max. If 1≤i≤(i_max) (Yes in step ST47), the processing proceeds to step ST48, and if i=−1 or 0 (No in step ST47), the processing skips step ST48 and proceeds to step ST49.

In step ST48, the memory controller 200 extracts, as a part of the data SB2, a bit classified into a (i−1)-th group (group (i−1)) in step ST32 from the data read in step ST42. The data SB2 is one page of data input into the ECC circuit 260 as a part of data used for soft-decision bit decoding along with the data SB1.

In step ST49, the memory controller 200 determines whether or not all the bits of the data HB, SB1, and SB2 are extracted (whether or not i=(i_max). If it is determined that all the bits of the data HB, SB1, and SB2 are extracted (i=(i_max) (Yes in step ST49), the processing proceeds to step ST51. On the other hand, if it is determined that not all the bits of the data HB, SB1, and SB2 are extracted (i<(i_max)) (No in step ST49), the processing proceeds to step ST50.

In step ST50, the memory controller 200 increments the variable i, and thereafter the processing returns to step ST42. In other words, the memory system 1 iterates the processing from step ST42 to step ST50 until all the bits of the data HB, SB1, and SB2 are extracted (namely, the variable i=(i_max)). It is thereby possible for the memory controller 200 to generate three pages of data HB, SB1, and SB2 from (i_max+2) page of data by a shift-read operation performed for (i_max+2) times.

In step ST51, the ECC circuit 260 performs soft-decision bit decoding based on the data HB, SB1, and SB2 generated from the extracted bits.

In step ST52, if an error is corrected by the soft-decision bit decoding in step ST51 (Yes in ST52), the memory controller 200 returns the error-corrected read data based on the soft-decision bit decoding to the host apparatus 300, and finishes the retry read operation. On the other hand, if an error cannot be corrected because the number of error bits exceeds the number of correctable error bits for the soft-decision bit decoding (No in step ST52), the processing proceeds to step ST53.

In step ST53, the memory controller 200 notifies the host apparatus 300 that the error cannot be corrected by the retry read operation, and finishes the retry read operation.

Through the operation as described above, the retry read operation is finished.

5.2 Extraction

Next, the extraction of bits in step ST44, ST46, and ST48 in FIG. 19 will be described with reference to FIG. 20.

FIG. 20 schematically shows how the bits in the data HB, SB1, and SB2 are extracted based on the above-described 10 groups for each bit. The example of FIG. 20 shows 16 bits (corresponding to bit lines BL0 through BL15) in a read target page, similarly to FIG. 18. The relationships between the bit line, the set of a back-surface side memory cell and a bit-line side memory cell, and the group into which the bit is classified as shown in FIG. 20 are the same as those shown in FIG. 18.

If i=−1, when data is read by a shift read operation SR(−1Δ) in step ST42, the memory controller 200 extracts from the data a bit corresponding to the bit line BL0 classified into Group 0 "$*_{-1,0}$" as a part of the data SB1 in step ST44.

If i=0, when data corresponding to Group 0 is read by a shift read operation SR(0Δ) in step ST42, the memory controller 200 extracts from the data a bit corresponding to the bit line BL4 classified into Group 1 "$*_{0,4}$" as a part of the data SB1 in step ST44. In step ST46, the memory controller 200 extracts from the data a bit corresponding to the bit line BL0 classified into Group 0 "$*_{0,0}$" as a part of the data HB.

If i=1, when data corresponding to Group 1 is read by a shift read operation SR(1Δ) in step ST42, the memory controller 200 extracts from the data a bit corresponding to the bit line BL1 and a bit corresponding to the bit line BL8 classified into Group 2, "$*_{1,1}$" and "$*_{1,8}$", as a part of the data SB1 in step ST44. In step ST46, the memory controller 200 extracts from the data a bit corresponding to the bit line BL4 classified into Group 1 "$*_{1,4}$" as a part of the data HB. In step ST48, the memory controller 200 extracts from the data a bit corresponding to the bit line BL0 classified into Group 0 "$*_{1,0}$" as a part of the data SB2.

Within the range of 2≤i≤8, bits of a part of each of the data HB, SB1, and SB2 are extracted, similarly to the case where i=1.

If i=9, when data corresponding to Group 9 is read by a shift read operation SR(9Δ) in step ST42, the memory controller 200 extracts from the data a bit corresponding to the bit line BL15 classified into Group 9 "$*_{9,15}$" as a part of the data HB in step ST46. In step ST48, the memory controller 200 extracts from the data a bit corresponding to the bit line BL11 classified into Group 8 "$*_{9,11}$" as a part of the data SB2.

If i=10, when data is read by a shift read operation SR(10Δ) in step ST42, the memory controller 200 extracts from the data a bit corresponding to the bit line BL15 classified into Group 9 "$*_{10,15}$" as a part of the data SB2 in step ST48.

Thus, three pages of data HB, SB1, and SB2 are generated from the results of twelve times of the shift read operations, SR(−1Δ) through SR(10Δ) (namely, 12 pages of data read by mutually different read voltages).

5.3 Advantageous Effects of Fifth Embodiment

According to the fifth embodiment, the memory system 1 performs, on a selected memory cell, shift read operations SR(−1Δ) and SR(10Δ) in addition to shift read operations SR(0Δ) through SR(9Δ) respectively corresponding to 10 groups into which a bit is classified. The memory controller 200 extracts a bit classified into Group i from the data read by a shift read operation SR(iΔ), and generates one page of the data HB. In addition, the memory controller 200 extracts a bit read from a selected memory cell corresponding to a bit classified into Group i by shift read operations SR((i−1)Δ) and SR((i+1)Δ), and generates one page of each of data SB1 and SB2. The ECC circuit 260 performs soft-decision bit decoding based on data HB, SB1, and SB2. It is thereby possible to apply a bit that is read with a use of an optimal shift amount (−1Δ through 10Δ) in soft-decision bit decoding for each bit and to improve accuracy of error correction.

6. Others

Various embodiments are described in the above; however, the first through fifth embodiments are not limited thereto, and various modifications can be adopted as appropriate.

For example, in the first through fifth embodiments, the ECC circuit 260 is provided in the memory controller 200; however, it may be provided outside of the memory controller 200. For example, the ECC circuit 260 may be provided in the NAND flash memory 100, or outside of the memory controller 200 and the NAND flash memory 100 within the memory system 1.

In the first through third embodiments, the LLRs are classified within the range from the voltage VA to (VA+Δ) in accordance with the results SB3 through SB6; however, the classification range of the LLRs is not limited thereto. For example, in the RAM 220, a LLR table for classification based on the range from voltage (VC−Δ) to VC, the range from VC to (VC+Δ), or any other ranges in accordance with the results SB3 through SB6, may be stored. It is thereby possible to perform soft-decision bit decoding in consideration of a back-surface side adjacent memory cell not only for the case where the memory cells written in an "Er" state are read on an erroneous assumption that the memory cells belong to an "A" state, but also the case where the memory cells written in an "C" state are read on an erroneous assumption that the memory cells belong to an "B" state, the case where the memory cells written in an "B" state are read on an erroneous assumption that the memory cells belong to an "C" state, or any other cases.

Furthermore, in the second and third embodiments, soft-decision bit decoding is performed in consideration of threshold voltages of a bit-line side adjacent memory cell and a source-line side adjacent memory cell in addition to a threshold voltage of a back-surface side of adjacent memory cell, if soft-decision bit decoding in consideration of the threshold voltage of the back-surface side adjacent memory cell fails; however, the second and third embodiments are not limited to this case. For example, after soft-decision bit decoding is performed without considering a threshold voltage of a back-surface side adjacent memory cell but with a consideration of threshold voltages of a bit-line side adjacent memory cell and a source-line side adjacent memory cell, and if the processing fails, soft-decision bit decoding may further performed in consideration of the threshold voltage of the back-surface side adjacent memory cell. In other words, steps ST16 and ST21 shown in FIG. 12 may be interchanged, along with the soft-decision bit decoding performed following these steps.

In the second embodiment, the soft-decision bit decoding in consideration of a bit-line side adjacent memory cell and a source-line side adjacent memory cell in addition to a back-surface side adjacent memory cell is described; however, the second embodiment is not limited thereto. For example, soft-decision bit decoding may be performed in consideration only of a bit-line side adjacent memory cell or a source-line side adjacent memory cell, in addition to a back-surface side adjacent memory cell.

In the second embodiment, it is explained that the influence imposed on the threshold voltage of a selected memory cell is higher if the threshold voltage of the back-surface side proximity memory cell is equal to or higher than the voltage VSSRnb than the influence if the threshold voltage of the back-surface side memory cell is lower than VSSRnb and the threshold voltages of the bit-line side proximity memory cell and the source-line proximity memory are equal to or higher than the voltages VSSR(n+1) and VSSR(n−1), respectively; however, the second embodiment is not limited thereto. In the third embodiment, it is explained that the influence imposed on the threshold voltage of a selected memory cell is higher if the threshold voltage of the back-surface side proximity memory cell is equal to or higher than the voltage VSSRnb and equal to or lower than VSSRnb_2 than the influence if the threshold voltage of the back-surface side memory cell is lower than the voltage VSSRnb and the threshold voltages of the bit-line side proximity memory cell and the source-line proximity memory are equal to or higher than the voltages VSSR(n+1) and VSSR(n−1), respectively; however, the third embodiment is not limited thereto. The magnitude relationship between the influence imposed on a selected memory cell by a threshold voltage of a back-surface side adjacent memory cell and the influence imposed on a selected memory cell by a threshold voltages of a bit-line side adjacent memory cell and a source-line side adjacent memory cell may be discretionally determined.

In the fourth and fifth embodiments, the threshold voltages of a back-surface side adjacent memory cell and a bit-line side adjacent memory cell are considered when a read target page is classified; however, the embodiments are not limited thereto. For example, the threshold voltage of a source-line side adjacent memory cell may be considered instead of a bit-line side adjacent memory cell, or the threshold voltages of a back-surface side adjacent memory cell, a bit-line side adjacent memory cell, and a source-line side adjacent memory cell may be considered. A read target page may be classified into (i_max) groups for each bit, in consideration only of the threshold voltage of a back-surface side adjacent memory cell. In this case, if the threshold voltage of the back-surface side adjacent memory cell is classified into (n+1) by n times of single-state read operation, (i_max) becomes an integer equal to or greater than 2 and equal to or smaller than (n+1).

In the first through fifth embodiments, two-bit data can be stored in a single memory cell transistor MC; however, the embodiments are not limited thereto, and applicable to the case where three-, four-, five-bits or greater data can be stored.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system comprising:
   a nonvolatile memory; and
   a memory controller, wherein
   the nonvolatile memory includes:
   a first memory cell and a second memory cell each configured to store data and coupled in parallel to a bit line;
   a first word line coupled to the first memory cell; and
   a second word line coupled to the second memory cell and differing from the first word line, and
   wherein
   the first memory cell and the second memory cell face each other between the first word line and the second word line, and
   the memory controller is configured to:
     read first data from the first memory cell;
     read second data from the second memory cell;
     read third data and fourth data from the first memory cell,
     decode data stored in the first memory cell based on the first data and the second data,
     the decoding includes decoding, in a first operation, the data stored in the first memory cell further based on the third data and the fourth data, and
   the first data, the third data, and the fourth data are read by applying mutually different voltages to the first word line.

2. The memory system of claim 1, wherein
   a first voltage applied to the first word line when the first data is read is higher than a second voltage applied to the first word line when the third data is read, and lower than a third voltage applied to the first word line when the fourth data is read.

3. The memory system of claim 1, wherein
   the decoding includes using, in the first operation, first likelihood information corresponding to a set of the first data, the second data, the third data, and the fourth data.

4. The memory system of claim 3, wherein
   the nonvolatile memory further includes a third memory cell adjacent to the first memory cell, and coupled in series to the first memory cell,
   the memory controller is configured to read fifth data from the third memory cell, and
   the decoding includes decoding, in a second operation, the data stored in the first memory cell further based on the third data, the fourth data, and the fifth data.

5. The memory system of claim 4, wherein
   the decoding includes using, in the second operation, second likelihood information corresponding to a set of the first data, the second data, the third data, the fourth data, and the fifth data, the second likelihood information is different from the first likelihood information.

6. The memory system of claim 5, wherein
   the memory controller is configured to read sixth data from the second memory cell,
   the decoding includes decoding, in a third operation, the data stored in the first memory cell further based on the third data, the fourth data, the fifth data, and the sixth data, and
   the second data and the sixth data are read by applying mutually different voltages to the second word line.

7. The memory system of claim 6, wherein
   a fourth voltage applied to the second word line when the second data is read is lower than a fifth voltage applied to the second word line when the sixth data is read.

8. The memory system of claim 6, wherein
   the decoding includes using, in the third operation, third likelihood information corresponding to a set of the first data, the second data, the third data, the fourth data, the fifth data, and the sixth data, the third likelihood information is different from the first likelihood information and the second likelihood information.

9. The memory system of claim 1, wherein
   the memory controller is configured to decode the data stored in the first memory cell based on the first data and the second data after hard-decision bit decoding of the first data fails.

10. The memory system of claim 1, wherein
    the memory controller is configured to read seventh data from the first memory cell, and
    the decoding includes:
      extracting, in a fourth operation, one of the first data or the seventh data based on the second data, and
      decoding, in the fourth operation, the data stored in the first memory cell using the extracted data.

11. The memory system of claim 10, wherein
    the nonvolatile memory further includes a third memory cell adjacent to the first memory cell, and coupled in series to the first memory cell, and
    the memory controller is configured to:
      read eighth data from the first memory cell; and
      read ninth data from the third memory cell and
    the decoding includes:
      extracting, in the fourth operation, the first data, the seventh data, or the eighth data further based on the ninth data; and
      decoding, in the fourth operation, the data stored in the first memory cell using the extracted data.

12. The memory system of claim 11, wherein
    the decoding includes decoding, in the fourth operation, the data stored in the first memory cell without using likelihood information.

13. The memory system of claim 1, wherein
    the memory controller is configured to read tenth, eleventh, and twelfth data from the first memory cell, and
    the decoding includes:
      extracting, in a fifth operation, three pieces of data from the first data, the tenth data, the eleventh data, or the twelfth data based on the second data; and decoding, in the fifth operation, the data stored in the first memory cell using fourth likelihood information corresponding to a set of the three pieces of extracted data.

14. The memory system of claim 13, wherein
the nonvolatile memory further includes a third memory cell adjacent to the first memory cell, and coupled in series to the first memory cell,
the memory controller is configured to:
   read thirteenth data from the first memory cell; and
   read fourteenth data from the third memory cell, and
the decoding includes:
   extracting, in the fifth operation, three from the first data, the tenth data, the eleventh data, the twelfth data, or the thirteenth data further based on the fourteenth data; and
   decoding, in the fifth operation, the data stored in the first memory cell using the fourth likelihood information.

15. A memory system comprising:
a nonvolatile memory; and
a memory controller, wherein
the nonvolatile memory includes:
a first memory cell and a second memory cell each configured to store data and coupled in parallel to a bit line;
a first word line coupled to the first memory cell; and
a second word line coupled to the second memory cell and differing from the first word line, and
wherein
the first memory cell faces the second memory cell with a semiconductor layer interposed therebetween, and
the memory controller is configured to:
   read first data from the first memory cell;
   read second data from the second memory cell; and
   decode data stored in the first memory cell based on the first data and the second data.

16. The memory system of claim 15, wherein
the first memory cell shares the semiconductor layer with the second memory cell.

17. The memory system of claim 15, wherein
a first node of the first memory cell is connected to the bit line,
a second node of the first memory cell is connected to a source line,
a third node of the second memory cell is connected to the bit line, and
a fourth node of the second memory cell is connected to the source line.

18. The memory system of claim 15, wherein
the first word line is provided in a first conductor, and
the second word line is provided in a second conductor isolated from the first conductor.

19. The memory system of claim 18, wherein
the first memory cell is provided between the semiconductor layer and the first conductor, and
the second memory cell is provided between the semiconductor layer and the second conductor.

20. The memory system of claim 18, wherein
the first conductor faces the second conductor across the semiconductor layer.

* * * * *